(12) United States Patent
Toyomura et al.

(10) Patent No.: US 10,998,394 B2
(45) Date of Patent: May 4, 2021

(54) DISPLAY DEVICE AND ELECTRONIC APPARATUS

(71) Applicant: Sony Semiconductor Solutions Corporation, Kanagawa (JP)

(72) Inventors: Naobumi Toyomura, Kanagawa (JP); Takuma Fujii, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/676,865

(22) Filed: Nov. 7, 2019

(65) Prior Publication Data

US 2020/0075705 A1 Mar. 5, 2020

Related U.S. Application Data

(63) Continuation of application No. 16/092,239, filed as application No. PCT/JP2017/027169 on Jul. 27, 2017, now Pat. No. 10,510,820.

(30) Foreign Application Priority Data

Sep. 9, 2016 (JP) ................................ 2016-176165

(51) Int. Cl.
*H01L 27/32* (2006.01)
*G09F 9/30* (2006.01)
(Continued)

(52) U.S. Cl.
CPC ............ *H01L 27/3272* (2013.01); *G09F 9/30* (2013.01); *G09G 3/20* (2013.01); *G09G 3/3233* (2013.01);
(Continued)

(58) Field of Classification Search
CPC ... G09G 2320/0219; G09G 2320/0209; G09G 2320/0214; H01L 27/3272; H01L 27/3244
See application file for complete search history.

(56) References Cited

U.S. PATENT DOCUMENTS 5,721,596 A 2/1998 Kochi
6,618,029 B1 * 9/2003 Ozawa ..................... G09G 3/30
257/40
(Continued)

FOREIGN PATENT DOCUMENTS

CN 1764336 A 4/2006
CN 103106872 A 5/2013
(Continued)

OTHER PUBLICATIONS

Extended European Search Report dated Feb. 5, 2019 for corresponding European Application No. 17848449.9.
(Continued)

*Primary Examiner* — Nicholas J Tobergte
(74) *Attorney, Agent, or Firm* — Michael Best & Friedrich LLP

(57) ABSTRACT

Provided is a display device including: a pixel unit in which a plurality of pixel circuits (PIX_A, PIX_B, PIX_C) each of which includes a light emitting element and a driving circuit configured to drive the light emitting element are arranged in a matrix form. In a diffusion layer in which transistors included in the driving circuits of the pixel circuits (PIX_A, PIX_B, PIX_C) are formed, an electricity supply region (223) that is an active area for supplying an electric potential to a well is provided between mutually adjacent ones of the pixel circuits (PIX_A, PIX_B, PIX_C).

20 Claims, 11 Drawing Sheets

(51) Int. Cl.
  *G09G 3/20* (2006.01)
  *G09G 3/3233* (2016.01)
  *H01L 27/12* (2006.01)

(52) U.S. Cl.
  CPC ...... *H01L 27/1214* (2013.01); *H01L 27/1222* (2013.01); *G09G 2300/0814* (2013.01); *G09G 2300/0852* (2013.01); *G09G 2320/0209* (2013.01); *G09G 2320/0214* (2013.01); *G09G 2320/0219* (2013.01); *G09G 2320/045* (2013.01); *H01L 27/3211* (2013.01); *H01L 27/3244* (2013.01); *H01L 27/3258* (2013.01); *H01L 27/3262* (2013.01)

(56) References Cited

U.S. PATENT DOCUMENTS

| | | | |
|---|---|---|---|
| 7,483,099 B2 | 1/2009 | Kamijo | |
| 7,764,251 B2* | 7/2010 | Yamashita | G09G 3/3233 345/76 |
| 8,519,456 B2 | 8/2013 | Masagaki et al. | |
| 8,759,914 B1* | 6/2014 | Rawat | H01L 23/5225 257/340 |
| 8,907,874 B2* | 12/2014 | Taneda | H01L 27/3279 345/76 |
| 9,449,552 B2 | 9/2016 | Lee et al. | |
| 9,653,020 B2* | 5/2017 | Uchino | G09G 3/3233 |
| 2002/0163459 A1 | 11/2002 | Nagao | |
| 2005/0174313 A1* | 8/2005 | Kawachi | G09G 3/3614 345/98 |
| 2005/0285122 A1* | 12/2005 | Choi | H01L 27/1285 257/88 |
| 2008/0088724 A1 | 4/2008 | Kudoh | |
| 2011/0079832 A1 | 4/2011 | Masagaki et al. | |
| 2011/0148516 A1 | 6/2011 | Tanaka et al. | |
| 2013/0076720 A1 | 3/2013 | Al-Dahle et al. | |
| 2014/0111557 A1 | 4/2014 | Omata et al. | |
| 2019/0123124 A1 | 4/2019 | Tamura | |

FOREIGN PATENT DOCUMENTS

| | | |
|---|---|---|
| CN | 104157665 A | 11/2014 |
| JP | 2000-284722 A | 10/2000 |
| JP | 2001-036408 A | 2/2001 |
| JP | 2001-195016 A | 7/2001 |
| JP | 2005-005227 A | 1/2005 |
| JP | 2005-077484 A | 3/2005 |
| JP | 2008-129157 A | 6/2008 |
| JP | 2013-113868 A | 6/2013 |
| JP | 2014-085384 A | 5/2014 |
| JP | 2014153492 A | 8/2014 |
| JP | 2017-120375 A | 7/2017 |
| WO | 2014/103500 A1 | 7/2014 |

OTHER PUBLICATIONS

Japanese Office Action dated Jan. 19, 2021 for corresponding Japanese Application No. 2018-538281.
Chinese Office Action dated Dec. 3, 2021 for corresponding Chinese Application No. 2017800255089.

* cited by examiner

FIG. 6
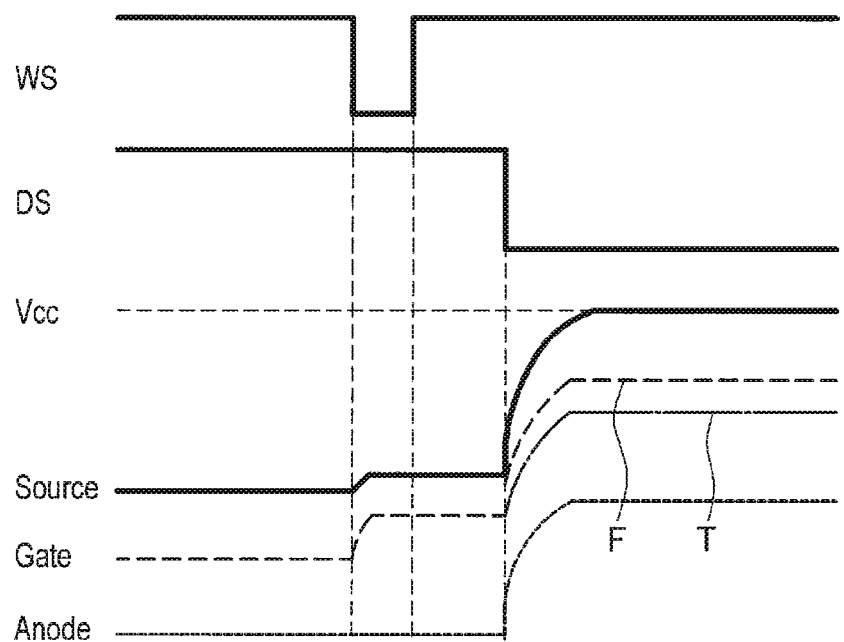
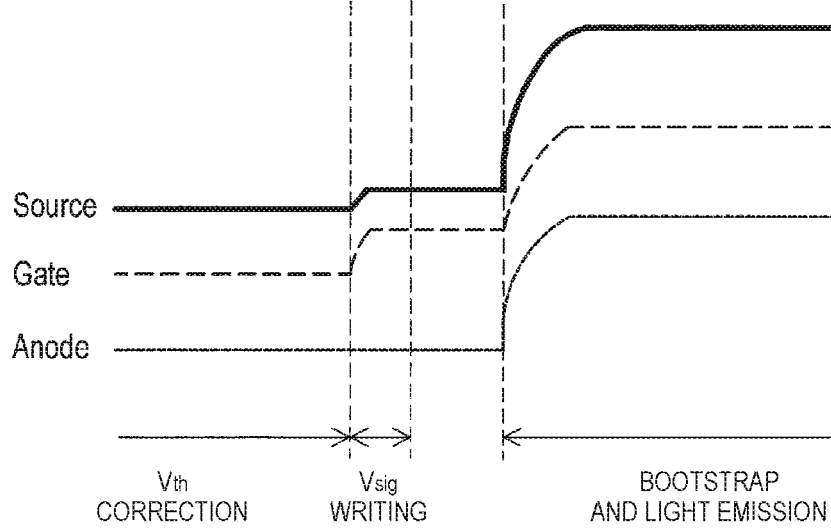

DISPLAY DEVICE AND ELECTRONIC APPARATUS

CROSS REFERENCES TO RELATED APPLICATIONS

The present application is a Continuation application of U.S. patent application Ser. No. 16/092,239 filed Oct. 9, 2018, which is a 371 National Stage Entry of International Application No.: PCT/JP2017/027169, filed on Jul. 27, 2017, which in turn claims priority from Japanese Application No. 2016-176165, filed on Sep. 9, 2016, the entire contents of which are incorporated herein by reference.

TECHNICAL FIELD

The present disclosure relates to a display device and an electronic apparatus.

BACKGROUND ART

A display device drivable by what is called an active matrix system usually has a configuration in which a light emitting element and a pixel circuit including a driving circuit for causing the light emitting element to be driven are provided in a position corresponding to each of the points of intersection of a plurality of scanning lines that extend along a lateral direction (hereinafter, occasionally referred to as a horizontal direction) of a display surface and are placed to be arranged in an upright direction (hereinafter, occasionally referred to as a vertical direction) of the display surface and a plurality of data lines (signal lines) that extend along the vertical direction and are placed to be arranged in the horizontal direction. One pixel circuit corresponds to one pixel or sub-pixel. The electric potentials of the scanning line and the signal line are changed at appropriate timings; thereby, the on/off of an active element (a transistor or the like) provided in the driving circuit in the pixel circuit is controlled as appropriate, and the light emission of the light emitting element in the pixel circuit is controlled. As a display device drivable by an active matrix system, for example, a display device in which an organic light emitting diode (OLED) is used as a light emitting element (hereinafter, occasionally referred to as an organic electroluminescence (EL) display device) is developed (for example, Patent Literatures 1 and 2).

CITATION LIST

Patent Literature

Patent Literature 1: WO 2014/103500
Patent Literature 2: JP 2013-113868A

DISCLOSURE OF INVENTION

Technical Problem

In a display surface of a display device drivable by an active matrix system, a plurality of pixel circuits are arranged in a matrix form. In this configuration, it is feared that a parasitic capacitance will be formed between an active area of a diffusion layer in a pixel circuit and an active area of a diffusion layer in an adjacent other pixel circuit, and coupling via the parasitic capacitance will be caused between the active areas. If coupling occurs, the operation of a pixel circuit influences the operation of an adjacent other pixel circuit; consequently, a desired emission luminance is not obtained, and a reduction in display quality may be caused. However, it cannot be said that, in the technologies described in Patent Literatures 1 and 2, the suppression of the influence of such coupling between adjacent pixel circuits has been studied sufficiently.

Here, these days, mounting on a wearable device is studied for an organic EL display device. In such a use, reduction in the size and weight is required of the organic EL display device in order to reduce the size and weight of the wearable device. However, in a case where it is attempted to thus make the size of the organic light emitting display device smaller, it is required to make the distance between adjacent pixel circuits shorter, and consequently the influence of coupling described above becomes more significant. Hence, particularly for a small-sized organic light emitting display device, a technology to suppress the influence of coupling between adjacent pixel circuits has been desired more strongly.

Thus, the present disclosure proposes a new and improved display device and a new and improved electronic apparatus capable of improving display quality more.

Solution to Problem

According to the present disclosure, there is provided a display device including: a pixel unit in which a plurality of pixel circuits each of which includes a light emitting element and a driving circuit configured to drive the light emitting element are arranged in a matrix form. In a diffusion layer in which transistors included in the driving circuits of the pixel circuits are formed, an electricity supply region that is an active area for supplying an electric potential to a well is provided between mutually adjacent ones of the pixel circuits.

In addition, according to the present disclosure, there is provided an electronic apparatus including: a display device configured to perform display on a basis of a video signal. The display device includes a pixel unit in which a plurality of pixel circuits each of which includes a light emitting element and a driving circuit configured to drive the light emitting element are arranged in a matrix form, and in a diffusion layer in which transistors included in the driving circuits of the pixel circuits are formed, an electricity supply region that is an active area for supplying an electric potential to a well is provided between mutually adjacent ones of the pixel circuits.

According to the present disclosure, in a pixel unit serving as a display surface of a display device, an electricity supply region is provided between mutually adjacent pixel circuits. The electricity supply region functions as a shield, and thereby interference between adjacent pixel circuits is suppressed. Therefore, each pixel circuit can perform a desired operation, and a desired luminance is obtained in each pixel circuit. Thus, display quality can be improved more.

Advantageous Effects of Invention

As described above, according to the present disclosure, display quality can be improved more. Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 6 is a timing waveform diagram when pixel circuits operate in a case where the ordinary layout shown in FIG. 5 is used.

MODE(S) FOR CARRYING OUT THE INVENTION

Figure 1:
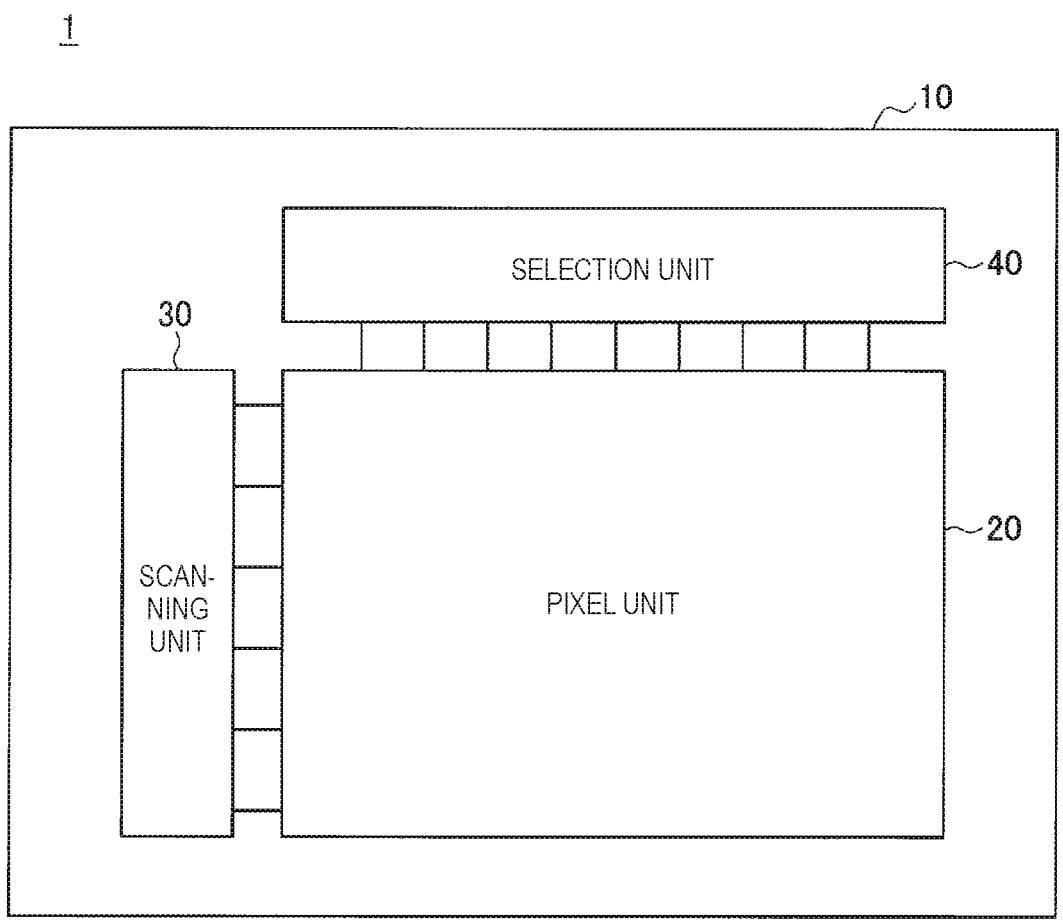
FIG. 1 is a schematic diagram showing an overall configuration of a display device according to the present embodiment.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that, in the drawings, the sizes etc. of some layers in the cross-sectional view and some areas in the top view showing a layout may be expressed exaggeratedly for the sake of description. The relative sizes of layers, areas, etc. shown in the drawings do not necessarily express the actual magnitude relationships between layers, areas, etc. accurately.

Further, in the following, an embodiment in which the display device is an organic EL display device is described as an example of the present disclosure. However, the present disclosure is not limited to this example, and the display device that is an object of the present disclosure may be various display devices as long as they are display devices drivable by an active matrix-type driving system.

Note that the description is given in the following order.
1. Overall configuration of display device
2. Configuration of pixel circuit
3. Operation of pixel circuit
4. Layout of pixel circuits
4-1. Ordinary layout
4-2. Layout according to present embodiment
5. Specific configuration example of display device
6. Application examples
7. Supplement (1. Overall Configuration of Display Device)

Figure 2:
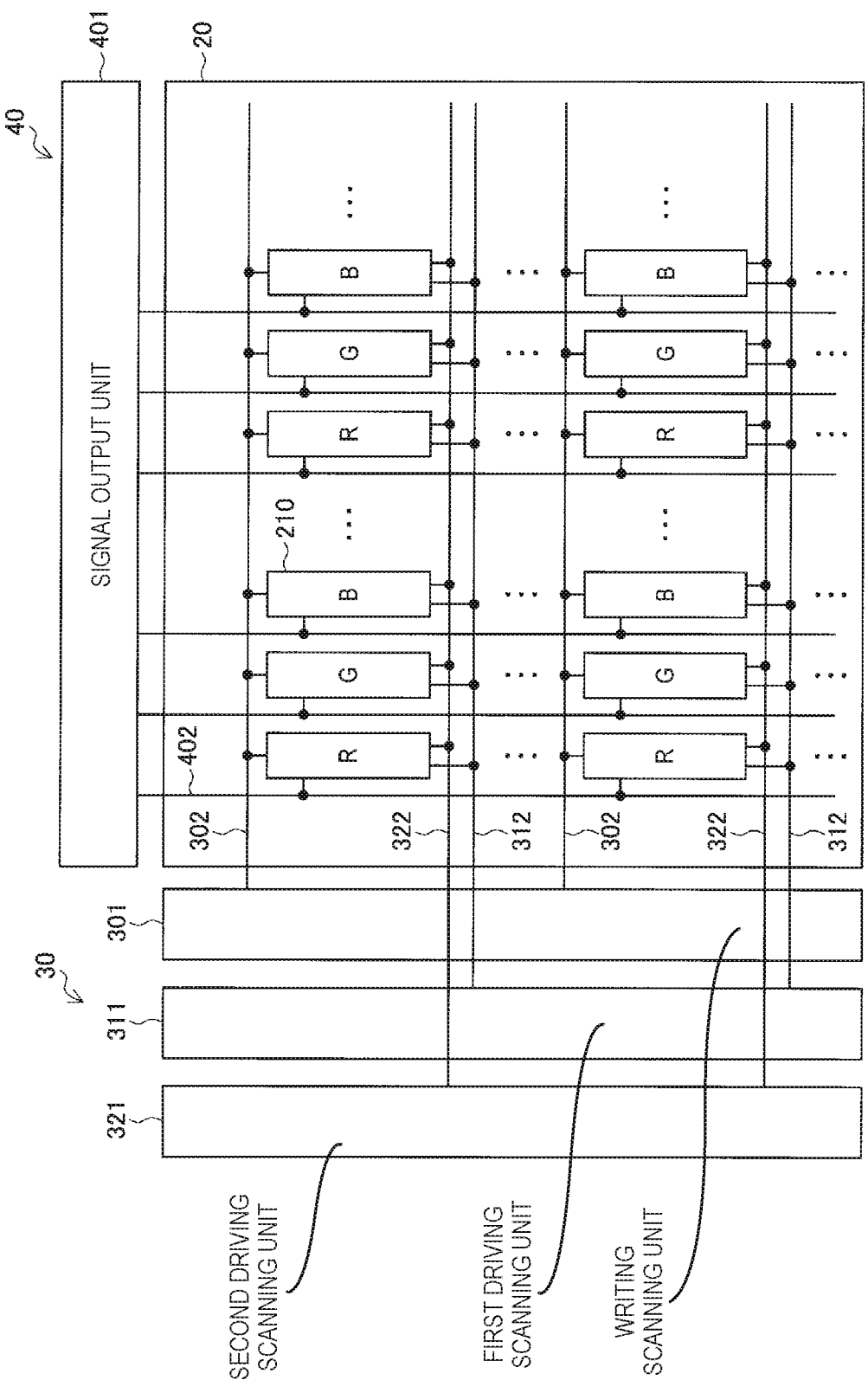
FIG. 2 is a schematic diagram showing a configuration of a pixel unit, a scanning unit, and a selection unit shown in FIG. 1, in more detail.

An overall configuration of a display device according to an embodiment of the present disclosure will now be described with reference to FIG. 1 and FIG. 2. FIG. 1 is a schematic diagram showing an overall configuration of a display device according to the present embodiment. FIG. 2 is a schematic diagram showing the configuration of a pixel unit, a scanning unit, and a selection unit shown in FIG. 1, in more detail.

Referring to FIG. 1, in a display device 1 according to the present embodiment, a pixel unit 20, a scanning unit 30, and a selection unit 40 are arranged on a display panel 10. As shown in FIG. 2, in the pixel unit 20, a plurality of pixel circuits 210 are arranged in a matrix form. Note that, although written as the pixel circuit 210 for the sake of convenience, "the pixel circuit 210" shown in FIG. 2 shows a portion excluding an interconnection layer of the pixel circuit 210; in practice, in the pixel circuit 210, interconnections (interconnections extending from the scanning unit 30 and the selection unit 40, a power supply line 332, etc. described later) may be connected to "the pixel circuit 210" shown in FIG. 2. That is, these interconnections may be provided in common to a plurality of pixel circuits 210, but they can also be parts of the pixel circuit 210; thus, in FIG. 2, a portion excluding the interconnection layer of the pixel circuit 210 is shown as the pixel circuit 210 for the sake of convenience. In the present specification, in a case of being written as "the pixel circuit 210," this component may thus refer to only a portion excluding the interconnection layer of the pixel circuit 210 for the sake of convenience.

One pixel circuit 210 corresponds to one sub-pixel. Here, the display device 1 is a display device capable of color display, and one pixel serving as a unit that forms a color image includes a plurality of sub-pixels. Specifically, one pixel includes three sub-pixels of a sub-pixel that emits red light, a sub-pixel that emits green light, and a sub-pixel that emits blue light. In FIG. 2, a color (R, G, or B) corresponding to each sub-pixel is simulatively written in each pixel circuit 210. Light emission in each pixel circuit 210 (that is, each sub-pixel) is controlled as appropriate, and thereby a desired image is displayed in the pixel unit 20. Thus, the pixel unit 20 corresponds to a display surface in the display device 1.

However, in the present embodiment, the combination of sub-pixels included in one pixel is not limited to a combination of sub-pixels of three primary colors of RGB. For example, in one pixel, sub-pixels of one color or a plurality of colors may further be added to sub-pixels of three primary colors. Specifically, for example, in one pixel, a sub-pixel that emits white light may be added to sub-pixels of three primary colors in order to improve the luminance; or in one pixel, at least one sub-pixel that emits light of a complementary color may be added to sub-pixels of three primary colors in order to expand the color reproduction range. Alternatively, in the display device 1, a sub-pixel may not exist, and one pixel circuit 210 may correspond to one pixel. Furthermore, alternatively, the display device 1 may not be one capable of color display, and may be one that performs monochrome display.

The scanning unit 30 is placed on one side in the horizontal direction of the pixel unit 20. A plurality of interconnections that are provided to be arranged in the vertical direction extend in the horizontal direction from the scanning unit 30 toward the pixel unit 20. Specifically, as shown in FIG. 2, the scanning unit 30 includes a writing scanning unit 301, a first driving scanning unit 311, and a second driving scanning unit 321. A plurality of scanning lines 302 extend from the writing scanning unit 301 toward the respective rows of the pixel circuits 210, a plurality of first driving lines 312 extend from the first driving scanning unit 311 toward the respective rows of the pixel circuits 210, and a plurality of second driving lines 322 extend from the second driving scanning unit 321 toward the respective rows of the pixel circuits 210. Each of these plurality of interconnections (the scanning lines 302, the first driving lines 312, and the second driving lines 322) is connected to the respective pixel circuits 210. The writing scanning unit 301, the first driving scanning unit 311, and the second driving scanning unit 321 change the electric potentials of these plurality of interconnections as appropriate, and thereby control the operation of each pixel circuit 210 so that a desired image can be displayed as the entire display surface. Details of the connection state between the scanning line 302, the first driving line 312, and the second driving line 322, and the pixel circuit 210, and functions of the writing scanning unit 301, the first driving scanning unit 311, and the second driving scanning unit 321 are described later with reference to FIG. 3.

The selection unit 40 is placed on one side in the vertical direction of the pixel unit 20. A plurality of interconnections that are provided to be arranged in the horizontal direction extend in the vertical direction from the selection unit 40 toward the pixel unit 20. Specifically, as shown in FIG. 2, the selection unit 40 includes a signal output unit 401. A plurality of signal lines 402 extend from the signal output unit 401 toward the respective columns of the pixel circuits 210. Each of the plurality of signal lines 402 is connected to the respective pixel circuits 210 in the pixel unit 20. The signal output unit 401 changes the electric potentials of the plurality of signal lines 402 as appropriate, and thereby controls the operation of each pixel circuit 210 so that a desired image can be displayed as the entire display surface. Details of the connection state between the signal line 402 and the pixel circuit 210, and functions of the signal output unit 401 are described later with reference to FIG. 3.

Thus, interconnections extending in the horizontal direction from the scanning unit 30 are provided to correspond to the respective rows of the pixel circuits 210 arranged in a matrix form, and are connected to the respective pixel circuits 210. Further, interconnections extending in the vertical direction from the selection unit 40 are provided to correspond to the respective columns of the pixel circuits 210 arranged in a matrix form, and are connected to the respective pixel circuits 210. Then, the electric potentials of these plurality of interconnections are changed by the scanning unit 30 and the selection unit 40 as appropriate, and thereby the operation of each pixel circuit of the pixel unit 20 is controlled.

(2. Configuration of Pixel Circuit)

Figure 3:
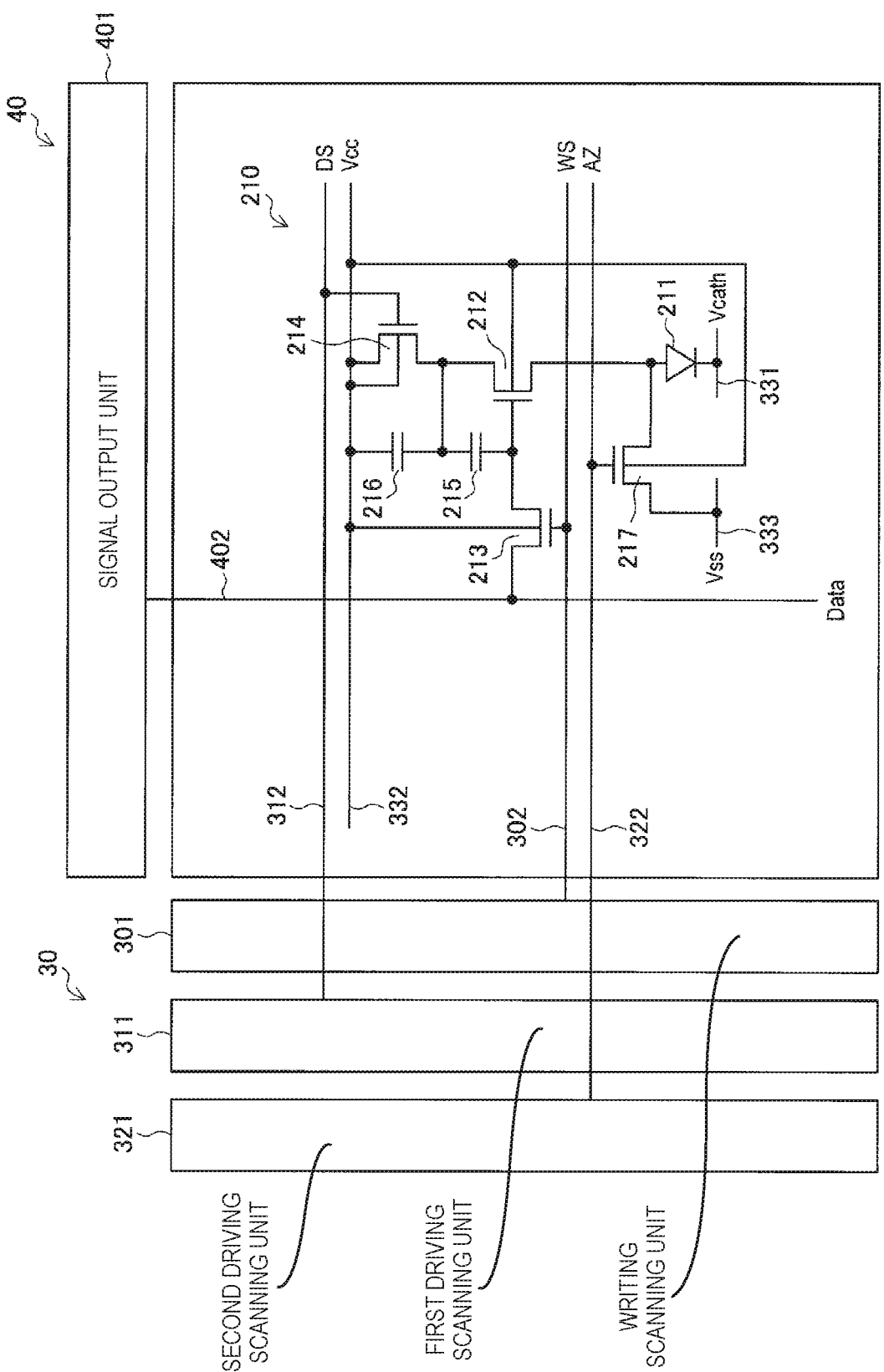
FIG. 3 is a schematic diagram showing a configuration of a pixel circuit shown in FIG. 2.

The configuration of the pixel circuit 210 shown in FIG. 2 will now be described with reference to FIG. 3. FIG. 3 is a schematic diagram showing the configuration of the pixel circuit 210 shown in FIG. 2. FIG. 3 shows a circuit configuration of one pixel circuit 210 among the plurality of pixel circuits 210 shown in FIG. 2, and shows the connection state to the pixel circuit 210 of the scanning line 302, the first driving line 312, the second driving line 322, and the signal line 402.

As shown in FIG. 3, the pixel circuit 210 includes an organic light emitting diode 211 that is a light emitting element and a driving circuit that drives the organic light emitting diode 211 by passing a current through the organic light emitting diode 211. The driving circuit includes four transistors that are active elements (a driving transistor 212, a sampling transistor 213, a light emission control transistor 214, and a switching transistor 217) and capacitance elements (a holding capacitance 215 and an auxiliary capacitance 216). In the pixel circuit 210, interconnections (the scanning line 302, the first driving line 312, the second driving line 322, and the signal line 402 mentioned above, a power supply line 332 described later, etc.) are connected to these elements.

Note that an organic light emitting diode having an ordinary structure may be used as the organic light emitting diode 211. Further, each of the driving transistor 212, the sampling transistor 213, the light emission control transistor 214, and the switching transistor 217 is a P-channel four-terminal (source/gate/drain/back gate) transistor formed on a semiconductor such as silicon, and the structure may be similar to an ordinary P-channel four-terminal transistor. Therefore, a detail description of the structures of the organic light emitting diode 211, the driving transistor 212, the sampling transistor 213, the light emission control transistor 214, and the switching transistor 217 is omitted herein.

The cathode electrode of the organic light emitting diode 211 is connected to a common power supply line 331 (electric potential: $V_{CATH}$ that is provided in common to all the pixel circuits 210 of the pixel unit 20. The drain electrode of the driving transistor 212 is connected to the anode electrode of the organic light emitting diode 211.

The drain electrode of the light emission control transistor 214 is connected to the source electrode of the driving transistor 212, and the source electrode of the light emission control transistor 214 is connected to a power supply line 332 (electric potential: $V_{cc}$; $V_{cc}$ being the power supply potential). Further, the gate electrode of the driving transistor 212 is connected to the drain electrode of the sampling transistor 213, and the source electrode of the sampling transistor 213 is connected to the signal line 402.

Therefore, by the sampling transistor 213 being brought into a conduction state, an electric potential corresponding to the electric potential of the signal line 402 is applied to the gate electrode of the driving transistor 212 (the electric potential of the signal line 402 is written), and the driving transistor 212 is brought into a conduction state. Further, in this event, by the light emission control transistor 214 being brought into a conduction state, an electric potential corresponding to the signal potential $V_{cc}$ is applied to the source electrode of the driving transistor 212, and a drain-source current $I_{ds}$ is generated in the driving transistor 212; thus, the organic light emitting diode 211 is driven. In this event, the magnitude of the drain-source current $I_{ds}$ changes in accordance with the gate potential $V_g$ of the driving transistor 212, and therefore the emission luminance of the organic light emitting diode 211 is controlled in accordance with the gate potential $V_g$ of the driving transistor 212, that is, the electric potential of the signal line 402 written by the sampling transistor 213.

Thus, the driving transistor 212 has the function of causing the organic light emitting diode 211 to be driven by the drain-source current $I_{ds}$ of the driving transistor 212. Further, the sampling transistor 213 controls the gate voltage of the driving transistor 212 in accordance with the electric potential of the signal line 402, that is, controls the on/off of the driving transistor 212; thus, the sampling transistor 213 has the function of writing the electric potential of the signal line 402 on the pixel circuit 210 (that is, has the function of sampling a pixel circuit 210 to write the electric potential of the signal line 402 on). Further, the light emission control transistor 214 controls the electric potential of the source electrode of the driving transistor 212, and thereby controls the drain-source current $I_{ds}$ of the driving transistor 212; thus, the light emission control transistor 214 has the function of controlling the light emission/non-light emission of the organic light emitting diode 211.

The holding capacitance 215 is connected between the gate electrode of the driving transistor 212 (that is, the drain electrode of the sampling transistor 213) and the source electrode of the driving transistor 212. That is, the holding capacitance 215 holds the gate-source voltage $V_{gs}$ of the driving transistor 212. The auxiliary capacitance 216 is connected between the source electrode of the driving transistor 212 and the power supply line 332. The auxiliary capacitance 216 has the action of suppressing the source potential of the driving transistor 212 varying when the electric potential of the signal line 402 is written.

The signal output unit 401 controls the electric potential of the signal line 402 (a signal line voltage Date) as appropriate, and thereby writes the electric potential of the signal line 402 on the pixel circuit 210 (specifically, as described above, the electric potential of the signal line 402 is written on a pixel circuit 210 selected by the sampling transistor 213). In the present embodiment, the signal output unit 401 selectively outputs a signal voltage $V_{sig}$ corresponding to a video signal, a first reference voltage $V_{ref}$, and a second reference voltage $V_{ofs}$ via the signal line 402. Here, the first reference voltage $V_{ref}$ is a reference voltage for causing the organic light emitting diode 211 to be extinguished reliably. Further, the second reference voltage $V_{ofs}$ is a voltage serving as a reference of the signal voltage $V_{sig}$ corresponding to a video signal (for example, a voltage equivalent to the black level of a video signal), and is used when performing a threshold correction operation described later.

The scanning line 302 is connected to the gate electrode of the sampling transistor 213. The writing scanning unit 301 controls the on/off of the sampling transistor 213 by changing the electric potential of the scanning line 302 (a scanning line voltage WS), and executes the processing of writing the electric potential of the signal line 402 described above (for example, the signal voltage $V_{sig}$ corresponding to a video signal) on the pixel circuit 210. In practice, as described with reference to FIG. 2, a plurality of scanning lines 302 are extended to the respective rows of a plurality of pixel circuits 210 arranged in a matrix form. When writing the electric potential of the signal line 402 on each pixel circuit 210, the writing scanning unit 301 sequentially supplies the scanning line voltage WS of a prescribed value to the plurality of scanning lines 302, and thereby scans the pixel circuits 210 on a row basis one after another.

Note that, also for the signal line 402, in practice a plurality of signal lines 402 are extended to the respective columns of a plurality of pixel circuits 210 arranged in a matrix form, as described with reference to FIG. 2. The signal voltage $V_{sig}$ corresponding to a video signal, the first reference voltage $V_{ref}$, and the second reference voltage $V_{ofs}$, which are alternatively outputted from the signal output unit 401, are written on the pixel circuits 210 via the plurality of signal lines 402, in units of pixel rows selected by scanning by the writing scanning unit 301. That is, the signal output unit 401 writes the electric potential of the signal line 402 on a row basis.

The first driving line 312 is connected to the gate electrode of the light emission control transistor 214. The first driving scanning unit 311 controls the on/off of the light emission control transistor 214 by changing the electric potential of the first driving line 312 (a first driving line voltage DS), and executes the processing of controlling the light emission/non-light emission of the organic light emitting diode 211 described above. In practice, as described with reference to FIG. 2, a plurality of first driving lines 312 are extended to the respective rows of a plurality of pixel circuits 210 arranged in a matrix form. In synchronization with scanning by the writing scanning unit 301, the first driving scanning unit 311 sequentially supplies the first driving line voltage DS of a prescribed value to the plurality of first driving lines 312, and thereby controls the light emission/non-light emission of each pixel circuit 210 as appropriate.

Here, further, in the pixel circuit 210, the source electrode of the switching transistor 217 is connected to the anode electrode of the organic light emitting diode 211. The drain electrode of the switching transistor 217 is connected to a ground line 333 (electric potential: $V_{ss}$; $V_{ss}$ being the ground potential). A current flowing through the driving transistor 212 during the non-light emission period of the organic light emitting diode 211 flows through the ground line 333 by means of a current path formed by the switching transistor 217.

Here, as described later, when driving the pixel circuit 210 according to the present embodiment, a threshold correction operation that corrects the threshold voltage $V_{th}$ of the driving transistor 212 is performed, and further a threshold correction preparation operation is performed as a pre-stage for performing the threshold correction operation. In the threshold correction preparation operation, an operation that initializes the gate potential $V_g$ and the source potential $V_s$ of the driving transistor 212 is performed, and consequently the gate-source voltage $V_{gs}$ of the driving transistor 212 becomes larger than the threshold voltage $V_{th}$ of the driving transistor 212. This is because, if the gate-source voltage $V_{gs}$ of the driving transistor 212 is not set larger than the threshold voltage $V_{th}$ of the driving transistor 212, the threshold correction operation cannot be performed properly.

Therefore, if the operation that initializes the gate potential $V_g$ and the source potential $V_s$ of the driving transistor 212 mentioned above is performed, a situation where the anode potential $V_{ano}$ of the organic light emitting diode 211 exceeds the threshold voltage $V_{thel}$ of the organic light emitting diode 211 in spite of the non-light emission period of the organic light emitting diode 211 may occur. Consequently, a current flows into the organic light emitting diode 211 from the driving transistor 212, and a phenomenon in which the organic light emitting diode 211 emits light in spite of the non-light emission period occurs.

Thus, in the present embodiment, a current circuit using the switching transistor 217 described above is provided in order to prevent such a phenomenon. Thereby, the current from the driving transistor 212 mentioned above does not flow into the organic light emitting diode 211 but flows into this current circuit, and unintentional light emission of the organic light emitting diode 211 can be prevented.

The second driving line 322 is connected to the gate electrode of the switching transistor 217. The second driving scanning unit 321 controls the on/off of the switching transistor 217 by changing the electric potential of the second driving line 322 (a second driving line voltage AZ). Specifically, the second driving scanning unit 321 changes the second driving line voltage AZ as appropriate, and thereby sets the switching transistor 217 in a conduction state and opens the current circuit described above during a light-emission-receiving period, more specifically, at least during a period in which the gate-source voltage $V_{gs}$ of the driving transistor 212 is set larger than the threshold voltage $V_{th}$ of the driving transistor 212 by performing the threshold correction preparation operation. In practice, as described with reference to FIG. 2, a plurality of second driving lines 322 are extended to the respective rows of a plurality of pixel circuits 210 arranged in a matrix form. The second driving scanning unit 321 sequentially supplies the second driving line voltage AZ of a prescribed value to the plurality of second driving lines 322 in synchronization with scanning by the writing scanning unit 301, and thereby controls the driving of the switching transistor 217 so that the switching transistor 217 is in a conduction state during the period mentioned above, as appropriate.

Note that the writing scanning unit 301, the first driving scanning unit 311, the second driving scanning unit 321, and the signal output unit 401 can be obtained using known techniques by means of various circuits capable of achieving the functions described above, such as a shift register circuit, and therefore a description of detailed circuit configurations of these units is omitted herein.

Hereinabove, the configuration of the pixel circuit 210 according to the present embodiment is described.

(3. Operation of Pixel Circuit)

Figure 4:
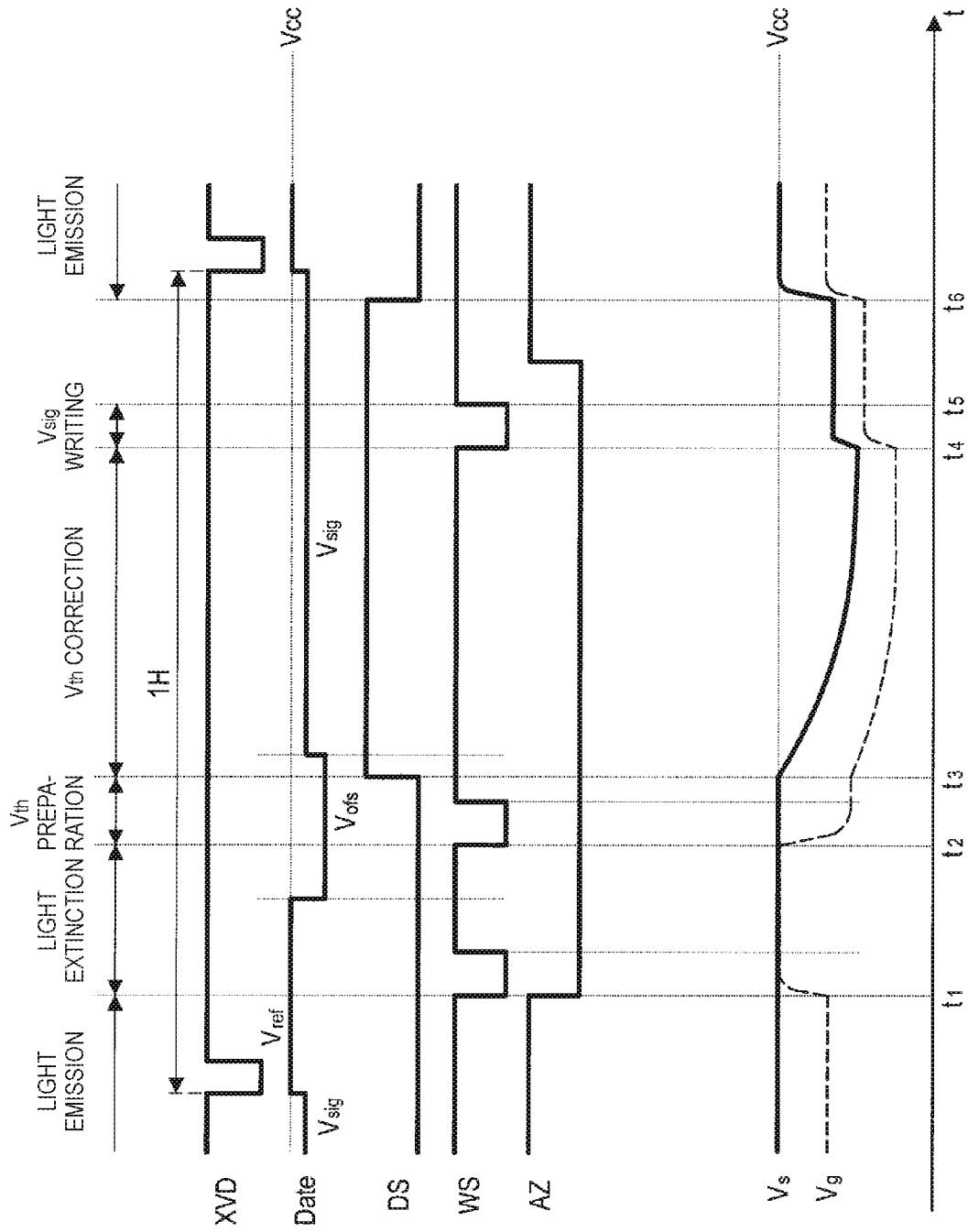
FIG. 4 is a diagram for describing operation of the pixel circuit according to the present embodiment.

The operation of the pixel circuit 210 described hereinabove will now be described. FIG. 4 is a diagram for describing the operation of the pixel circuit 210 according to the present embodiment. FIG. 4 shows a timing waveform diagram of signals related to the operation of the pixel circuit 210. Specifically, FIG. 4 shows manners of changes in one horizontal period (one H-period) of the electric potential of the signal line 402 (the signal line voltage Date), the electric potential of the scanning line 302 (the scanning line voltage WS), the electric potential of the first driving line 312 (the first driving line voltage DS), the electric potential of the second driving line 322 (the second driving line voltage AZ), the source potential $V_s$ of the driving transistor 212, and the gate potential $V_g$ of the driving transistor 212.

It is noted that, since each of the sampling transistor 213, the light emission control transistor 214, and the switching transistor 217 is of a P-channel type, these transistors are in an ON state, that is, a conduction state when the scanning line voltage WS, the first driving line voltage DS, and the second driving line voltage AZ are in a low electric potential state, respectively, and these transistors are in an off state, that is, a non-conduction state when the scanning line voltage WS, the first driving line voltage DS, and the second driving line voltage AZ are in a high electric potential state, respectively. Also for the driving transistor 212, similarly, the driving transistor 212 is in a conduction state in a case where the gate potential $V_g$ is a low electric potential, and the driving transistor 212 is in a non-conduction state in a case where the gate potential $V_g$ is a high electric potential. Further, as described above, any of the signal voltage $V_{sig}$ corresponding to a video signal, the first reference voltage $V_{ref}$ and the second reference voltage $V_{ofs}$ is alternatively selected for the signal line voltage Date. In the waveform diagram shown in FIG. 4, $V_{ref}=V_{cc}$ (the power supply potential), as an example.

At the time of the ending of a light emission period of the organic light emitting diode 211, the scanning line voltage WS transitions from a high electric potential to a low electric potential, and the sampling transistor 213 is brought into a conduction state (time $t_1$). On the other hand, at time $t_1$, the signal line voltage Date is in a state of being controlled to the first reference voltage $V_{ref}$. Therefore, by the transition of the scanning line voltage WS from a high electric potential to a low electric potential, the gate-source voltage $V_{gs}$ of the driving transistor 212 becomes less than or equal to the threshold voltage $V_{th}$ of the driving transistor 212, and thus the driving transistor 212 is cut off. If the driving transistor 212 is cut off, the path of current supply to the organic light emitting diode 211 is cut off, and therefore the anode potential $V_{ano}$ of the organic light emitting diode 211 decreases gradually. With time, if the anode potential $V_{ano}$ becomes less than or equal to the threshold voltage $V_{thel}$ of the organic light emitting diode 211, the organic light emitting diode 211 enters a light extinction state completely (the period of time $t_1$ to time $t_2$; a light extinction period).

Subsequently to the light extinction period, a period in which a preparation operation (a threshold correction preparation operation) before performing a threshold correction operation described later is performed is provided (the period of time $t_2$ to time $t_3$; a threshold correction preparation period). Specifically, at time $t_2$, which is a timing at which the threshold correction preparation period is started, the scanning line voltage WS transitions from a high electric potential to a low electric potential, and thereby the sampling transistor 213 enters a conduction state. On the other hand, at time $t_2$, the signal line voltage Date is in a state of being controlled to the second reference voltage $V_{ofs}$. By the sampling transistor 213 entering a conduction state in a state where the signal line voltage Date is the second reference voltage $V_{ofs}$, the gate potential $V_g$ of the driving transistor 212 becomes the second reference voltage $V_{ofs}$.

Further, at time $t_2$, the first driving line voltage DS is in a low electric potential state, and the light emission control transistor 214 is set in a conduction state. Therefore, the source potential $V_s$ of the driving transistor 212 is the power supply voltage $V_{cc}$. In this event, the gate-source voltage $V_{gs}$ of the driving transistor 212 is $V_{gs}=V_{ofs}-V_{cc}$.

Here, to perform the threshold correction operation, it is necessary that the gate-source voltage $V_{gs}$ of the driving transistor 212 be set larger than the threshold voltage $V_{th}$ of the driving transistor 212. Hence, each voltage value is set such that $|V_g|=|V_{ofs}-V_{cc}|>|V_{th}|$.

Thus, the initialization operation that sets the gate potential $V_g$ of the driving transistor 212 to the second reference voltage $V_{ofs}$ and sets the source potential $V_s$ of the driving transistor 212 to the power supply voltage $V_{cc}$ is the threshold correction preparation operation. That is, the second reference voltage $V_{ofs}$ and the power supply voltage $V_{cc}$ are the initialization voltages of the gate potential $V_g$ and the source potential $V_s$ of the driving transistor 212, respectively.

If the threshold correction preparation period ends, next, the threshold correction operation that corrects the threshold voltage $V_{th}$ of the driving transistor 212 is performed (the period of time $t_3$ to time $t_4$; a threshold correction period). In the period in which the threshold correction operation is performed, first, at time $t_3$, which is the timing at which the threshold correction period is started, the first driving line voltage DS transitions from a low electric potential to a high electric potential, and the light emission control transistor 214 enters a non-conduction state. Thereby, the source potential $V_s$ of the driving transistor 212 enters a floating state. On the other hand, at time $t_3$, the scanning line voltage WS is in a state of being controlled to a high electric potential, and the sampling transistor 213 is in a non-conduction state. Therefore, at time $t_3$, also the gate potential $V_g$ of the driving transistor 212 is in a floating state, and the source electrode and the gate electrode of the driving transistor 212 enter a state of being connected together via the holding capacitance 215, in a state of floating with each other. Thereby, as illustrated, the source potential $V_s$ and the gate potential $V_g$ of the driving transistor 212 gradually change to prescribed values in accordance with the threshold voltage $V_{th}$ of the driving transistor 212.

Thus, the operation that, using the initialization voltage $V_{ofs}$ of the gate potential $V_g$ of the driving transistor 212 and the initialization voltage $V_{cc}$ of and the source potential $V_s$ of the driving transistor 212 as references, changes the source potential $V_s$ and the gate potential $V_g$ of the driving transistor 212 to prescribed values in accordance with the threshold voltage $V_{th}$ of the driving transistor 212, in a floating state, is the threshold correction operation. If the threshold correction operation progresses, the gate-source voltage $V_{gs}$ of the driving transistor 212 stabilizes to the threshold voltage $V_{th}$ of the driving transistor 212 with time. A voltage equivalent to the threshold voltage $V_{th}$ is held in the holding capacitance 215.

Here, as a matter of course, a design value exists for the threshold voltage $V_{th}$ of the driving transistor 212; however, due to manufacturing variations etc., the actual threshold voltage $V_{th}$ does not always coincide with the design value. In this regard, by performing a threshold correction operation like the above, a voltage equivalent to the actual threshold voltage $V_{th}$ can be caused to be held in the holding capacitance 215 before the organic light emitting diode 211 is caused to emit light. Thereby, after that, when causing the driving transistor 212 to be driven in order to cause the organic light emitting diode 211 to emit light, a variation in the threshold voltage $V_{th}$ of the driving transistor 212 can be canceled, as described later. Therefore, the driving of the driving transistor 212 can be controlled with better precision, and a desired luminance can be obtained more favorably.

If the threshold correction period ends, next, a signal writing operation that writes the signal voltage $V_{sig}$ corresponding to a video signal is performed (the period of time $t_4$ to time $t_5$: a signal writing period). In the signal writing period, at time $t_4$, which is the timing at which the signal writing period is started, the scanning line voltage WS transitions from a high electric potential to a low electric potential, and the sampling transistor 213 is brought into a conduction state. On the other hand, at time $t_4$, the signal line voltage Date is in a state of being controlled to the signal voltage $V_{sig}$ in accordance with a video signal, and therefore the signal voltage $V_{sig}$ in accordance with a video signal is written on the holding capacitance 215. When writing the signal voltage $V_{sig}$ corresponding to a video signal, the auxiliary capacitance 216 connected between the source electrode of the driving transistor 212 and the power supply line 332 plays the role of suppressing the variation in the source potential $V_s$ of the driving transistor 212. Then, at the time when the signal voltage $V_{sig}$ in accordance with a video signal is written, that is, at the time when the signal voltage $V_{sig}$ in accordance with a video signal is applied to the gate electrode of the driving transistor 212 and the driving transistor 212 is driven, the threshold voltage $V_{th}$ of the driving transistor 212 is canceled by the voltage equivalent to the threshold voltage $V_{th}$ that is held in the holding capacitance 215 as a result of the threshold correction operation. That is, by having performed the threshold correction operation mentioned above, the variation in the threshold voltage $V_{th}$ of the driving transistor 212 between pixel circuits 210 is canceled.

At time $t_5$, the scanning line voltage WS transitions from a low electric potential to a high electric potential, and the sampling transistor 213 is brought into a non-conduction state; thereby, the signal writing period ends. If the signal writing period ends, next, a light emission period is started from time $t_6$. At time $t_6$, which is the timing at which the light emission period is started, the first driving line voltage DS transitions from a high electric potential to a low electric potential, and thereby the light emission control transistor 214 is brought into a conduction state. Thus, a current is supplied from the power supply line 332 having the power supply voltage $V_{cc}$ to the source electrode of the driving transistor 212 via the light emission control transistor 214.

In this event, due to the fact that the sampling transistor 213 is in a non-conduction state, the gate electrode of the driving transistor 212 is electrically separated from the signal line 402, and is in a floating state. When the gate electrode of the driving transistor 212 is in a floating state, the holding capacitance 215 is connected between the gate and the source of the driving transistor 212, and thereby the gate potential $V_g$ varies in conjunction with the variation in the source potential $V_s$ of the driving transistor 212. That is, the source potential $V_s$ and the gate potential $V_g$ of the driving transistor 212 rise while holding the gate-source voltage $V_{gs}$ held in the holding capacitance 215. Then, the source potential $V_s$ of the driving transistor 212 rises up to a light emission voltage $V_{oled}$ of the organic light emitting diode 211 in accordance with the saturation current of the transistor.

The operation in which the gate potential $V_g$ of the driving transistor 212 varies in conjunction with the variation in the source potential $V_s$ in this way is referred to as a bootstrap operation. In other words, the bootstrap operation is an operation in which the gate potential $V_g$ and the source potential $V_s$ of the driving transistor 212 vary while holding the gate-source voltage $V_{gs}$ held in the holding capacitance 215, that is, the voltage between both ends of the holding capacitance 215.

Then, the drain-source current $I_{ds}$ of the driving transistor 212 begins to flow through the organic light emitting diode 211, and thereby the anode potential $V_{ano}$ of the organic light emitting diode 211 rises in accordance with the drain-source current $I_{ds}$. With time, if the anode potential $V_{ano}$ of the organic light emitting diode 211 exceeds the threshold voltage $V_{thel}$ of the organic light emitting diode 211, a driving current begins to flow through the organic light emitting diode 211, and the organic light emitting diode 211 starts light emission.

The operations described hereinabove are executed in each pixel circuit 210 within one H-period. Note that, as described above, the switching transistor 217 is one for preventing unintentional light emission of the organic light emitting diode 211 that occurs due to a current flowing from the driving transistor 212 toward the organic light emitting diode 211 in the non-light emission period; hence, the second driving line voltage AZ is controlled so that the switching transistor 217 is in a conduction state in the non-light emission period, as appropriate. In the shown example, at time $t_1$ at which a light emission period ends, the second driving line voltage AZ transitions from a high electric potential to a low electric potential; and immediately before time $t_6$ at which the next light emission period is ended or started, the second driving line voltage AZ transitions from a low electric potential to a high electric potential.

Note that, in regard to the overall configuration of the display device 1, the configuration of the pixel circuit 210, and the operation of the pixel circuit 210 according to the present embodiment described hereinabove, Patent Literature 1 above, which is a prior application by the present applicant, may be referred to except for the respects described later in (4-2. Layout according to present embodiment) below. In other words, the overall configuration of the display device 1, the configuration of the pixel circuit 210, and the operation of the pixel circuit 210 according to the present embodiment may be similar to those described in Patent Literature 1 above except for the respects described later in (4-2. Layout according to present embodiment) below. However, what is described hereinabove is only an example, and the present embodiment is not limited to this example. It is sufficient that the respects described later in (4-2. Layout according to present embodiment) below be reflected in the display device 1 according to the present embodiment, and various known configurations used in ordinary display devices may be used for the other respects (4. Layout of Pixel Circuits)

A layout of a diffusion layer that is a layer in which the transistors of pixel circuits 210 according to the present embodiment described hereinabove are formed will now be described. Herein, first, an ordinary existing layout is described in order to make the effect obtained by the layout according to the present embodiment clearer.

(4-1. Ordinary Layout)

Figure 5:
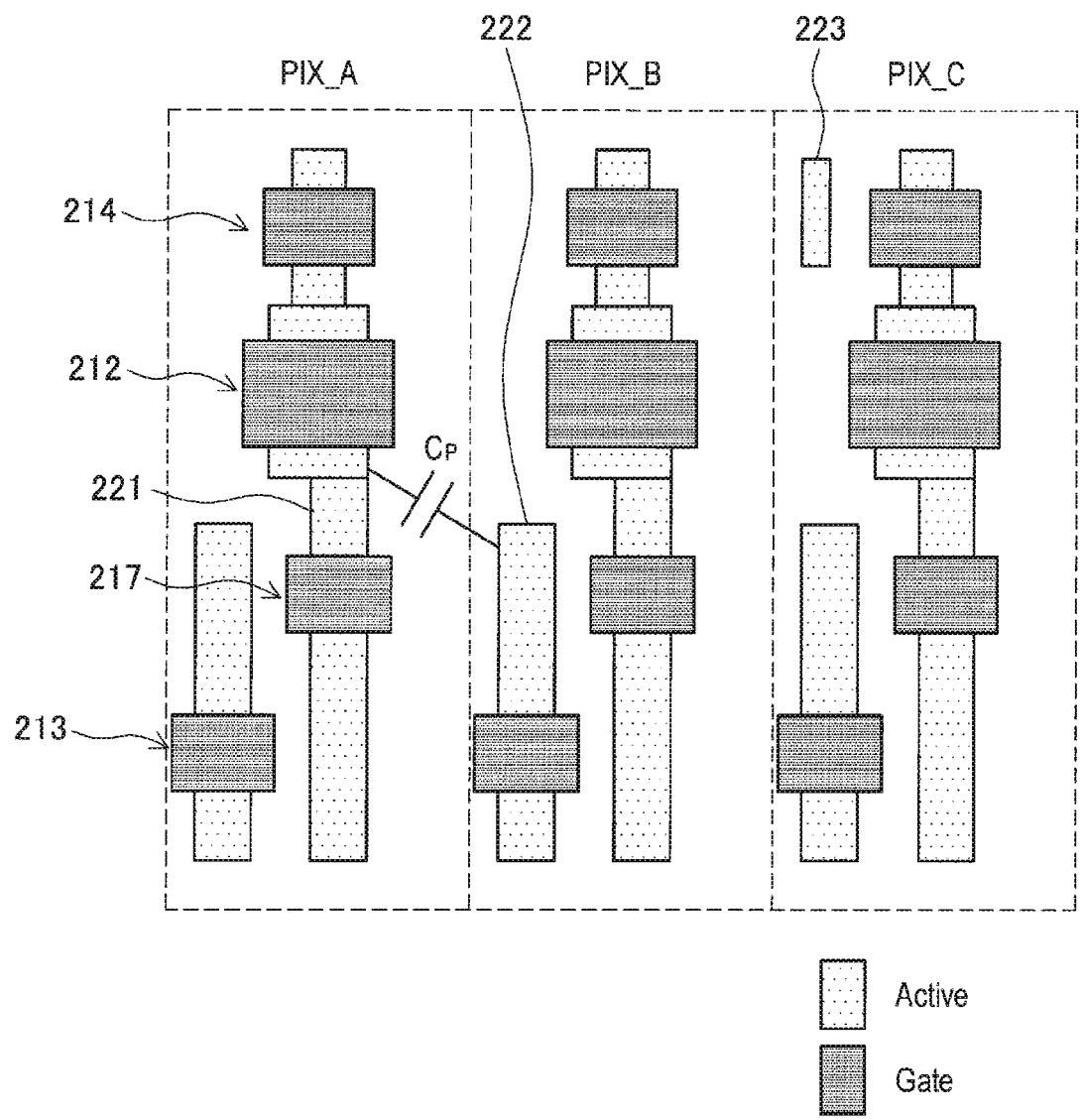
FIG. 5 is a top view schematically showing an example of an ordinary layout in a case where a diffusion layer of pixel circuits according to the present embodiment has the ordinary layout.

A case where the diffusion layer of pixel circuits 210 according to the present embodiment has an ordinary layout will now be considered. FIG. 5 is a top view schematically showing an example of an ordinary layout in a case where the diffusion layer of pixel circuits 210 according to the present embodiment has the ordinary layout. In practice, a plurality of sub-pixels (that is, pixel circuits 210) are placed to be arranged in a matrix form in the pixel unit 20 of the display device 1; but FIG. 5 shows a layout of pixel circuits 210 corresponding to adjacent three sub-pixels (PIX_A, PIX_B, and PIX_C), for the sake of description.

In the pixel circuit 210 according to the present embodiment, each transistor of the pixel circuit 210 is formed on a silicon substrate (the pixel circuit 210 is formed on what is called a silicon back plane). In FIG. 5, the layout of the diffusion layer is shown in a simplified manner; in the diffusion layer, active areas corresponding to a source region and a drain region of each transistor included in the pixel circuit 210 and a gate region functioning as the gate electrode of each transistor are expressed by mutually different types of hatching. In the drawing, the region not hatched with dots in the sub-pixel is, for example, an isolation region in which an oxide is formed by any of various known methods such as shallow trench isolation (STI) and local oxidation of silicon (LOCOS).

In each sub-pixel, region 221 that is the drain region of the driving transistor 212 and furthermore corresponds to the source region of the switching transistor 217 is a region where the anode electrode of the organic light emitting diode 211, which is formed on the upper side of the shown transistor layer, is connected (see also FIG. 3 described above). Hereinafter, region 221 may be referred to as an anode region 221 for the sake of convenience. Further, region 222 corresponding to the drain region of the sampling transistor 213 of PIX_B among these sub-pixels is a region where the gate electrode of the driving transistor is connected (see also FIG. 3 described above). Hereinafter, region 222 may be referred to as a gate region 222 for the sake of convenience.

Further, an electricity supply region 223 that is an active area for supplying an electric potential to wells is provided in PIX_C among the three sub-pixels. The electric potentials of the wells in these sub-pixels are the same; hence, in the ordinary layout, electricity supply regions 223 may be provided at a ratio of one to several sub-pixels, as illustrated.

The influence that the operation of the pixel circuit 210 of PIX_A gives on the operation of the pixel circuit 210 of the adjacent PIX_B in this layout will now be considered. In the example of the layout shown in FIG. 5, the anode region 221 of PIX_A and the gate region 222 of PIX_B are located at a relatively near distance. Therefore, as illustrated, a parasitic capacitance $C_p$ can exist between both. In a case where the parasitic capacitance $C_p$ exists, there is a concern that the operation of the pixel circuit 210 of PIX_B will not be performed properly, due to the parasitic capacitance $C_p$.

FIG. 6 is a timing waveform diagram when pixel circuits 210 operate in a case where the ordinary layout shown in FIG. 5 is used. FIG. 6 mainly shows a timing waveform diagram corresponding to the signal writing period to the light emission period described with reference to FIG. 4. FIG. 6 shows, for the sake of description, waveforms of the scanning line voltage WS, the first driving line voltage DS, the gate potential (Gate) and the source potential (Source) of the driving transistor 212, and the electric potential (Anode) of the anode region 221 (this is the anode potential of the organic light emitting diode 211 and is equal to the drain potential of the driving transistor 212) of PIX_B, and waveforms of the gate potential (Gate) and the source potential (Source) of the driving transistor 212 and the electric potential (Anode) of the anode region 221 of PIX_A.

Referring to FIG. 6, the signal voltage $V_{sig}$ corresponding to a video signal is written in the signal writing period, then the first driving line voltage DS transitions from a high electric potential to a low electric potential, and thereby the state shifts to the light emission period. In this event, as described above, both the gate potential and the source potential of the driving transistor 212 rise up to prescribed values by the bootstrap operation.

Here, if the parasitic capacitance $C_p$ described above exists between the anode region 221 of PIX_A and the gate region 222 of PIX_B, the variation in the electric potential of the anode region 221 of PIX_A influences the gate region 222 of PIX_B via the parasitic capacitance $C_p$. Specifically, if the parasitic capacitance of the gate region 222 of PIX_B is denoted by $C_{p\_b}$ and the variation in the electric potential of the anode region 221 of PIX_A is denoted by $\Delta V_{ano}$, the amount of variation in the electric potential of the gate region 222 of PIX_B, $\Delta V_B$, is expressed by Mathematical Formula (1) below.

[Math. 1]

$$\Delta V_B = \Delta V_{ano} \times \frac{C_p}{C_p + C_{p\_b}} \qquad (1)$$

That is, the electric potential of the gate region 222, that is, the gate potential of the driving transistor 212 of PIX_B deviates by $\Delta V_B$ from the value that should originally be set, due to the influence of the variation in the electric potential of the anode region 221 of PIX_A via the parasitic capacitance $C_p$. In FIG. 6, for the gate potential of the driving transistor 212 of PIX_B, curve T indicating a desired electric potential and curve F indicating an electric potential deviated by $\Delta V_B$ are simulatively shown. If in this way the gate potential of the driving transistor 212 of PIX_B deviates by $\Delta V_B$, also the gate-source voltage $V_{gs}$ of the driving transistor 212 of PIX_B deviates by $\Delta V_B$. Therefore, also the drain-source current $I_{ds}$ of the driving transistor 212 deviates from the original design value, and a desired luminance is not obtained for the organic light emitting diode 211 of PIX_B.

As described hereinabove, in a case where the ordinary layout is used for the diffusion layer, a parasitic capacitance $C_p$ can occur between active areas of adjacent pixel circuits 210. Then, there is a concern that, by coupling via the parasitic capacitance $C_p$, the operation of a pixel circuit 210 will influence the operation of an adjacent other pixel circuit 210. Therefore, a desired luminance is not obtained as a pixel, and display quality may be reduced. Note that, although herein interference between PIX_A and PIX_B is described as an example, a similar phenomenon can occur also between PIX_B and PIX_C, and further between not-shown other adjacent sub-pixels, as a matter of course.

(4-2. Layout According to Present Embodiment)

Figure 7:
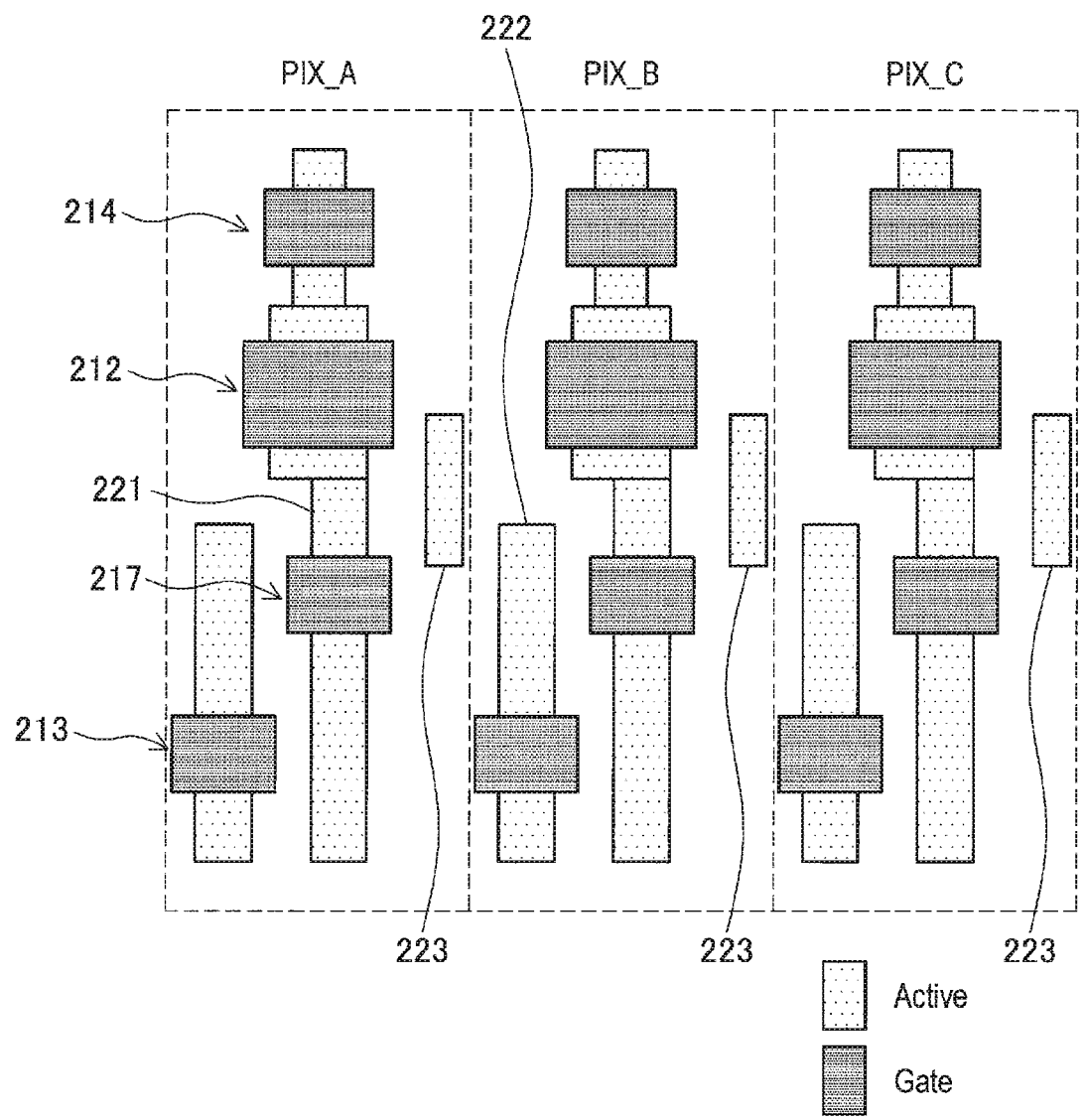
FIG. 7 is a top view schematically showing an example of a layout of a diffusion layer of pixel circuits according to the present embodiment.

In the present embodiment, the trouble that may occur in the ordinary layout described hereinabove can be solved by modifying the layout. A layout of a diffusion layer of pixel circuits 210 according to the present embodiment will now be described with reference to FIG. 7. FIG. 7 is a top view schematically showing an example of a layout of a diffusion layer of pixel circuits 210 according to the present embodiment.

FIG. 7 shows, similarly to FIG. 5, a layout of pixel circuits 210 corresponding to adjacent three sub-pixels (PIX_A, PIX_B, and PIX_C). Further, in FIG. 7, like in FIG. 5, the layout of the diffusion layer is shown in a simplified manner, and active areas corresponding to a source region and a drain region of each transistor included in the pixel circuit 210 and a gate region functioning as the gate electrode of each transistor are expressed by mutually different types of hatching. In the drawing, the region not hatched with dots in the sub-pixel is an isolation region.

Referring to FIG. 7, in the layout of the diffusion layer according to the present embodiment, the layout of transistors may be similar to the ordinary layout shown in FIG. 5. However, in the present embodiment, the arrangement of electricity supply regions 223 is different from the ordinary layout.

Specifically, in the present embodiment, the electricity supply region 223 is provided in each sub-pixel as shown in FIG. 7. Then, in each sub-pixel, the electricity supply region 223 is provided in a part between adjacent sub-pixels where active areas are proximate, that is, a part where a parasitic capacitance $C_p$ is likely to occur. In the shown example, the electricity supply region 223 is provided between the anode region 221 of a sub-pixel and the gate region 222 of an adjacent sub-pixel (for example, between the anode region 221 of PIX_A and the gate region 222 of PIX_B, etc.), where a parasitic capacitance $C_p$ could occur in the ordinary layout. In this layout, the electricity supply region 223 plays the role of a shield; therefore, the occurrence of a parasitic capacitance $C_p$ between active areas of adjacent pixel circuits 210 is suppressed, and the influence that the operation of a pixel circuit 210 gives on the operation of an adjacent other pixel circuit 210 can be lessened. Thus, a desired luminance is obtained for each sub-pixel, and display quality can be improved.

Note that, since the electricity supply region 223 is originally provided in order to supply an electric potential to wells, in the present embodiment it is not necessary to newly provide a dedicated configuration for a shield. Therefore, the effect of a shield can be obtained between adjacent pixel circuits 210 without increasing the area of the pixel circuit 210. Further, since it is not necessary to newly provide a dedicated configuration for a shield, it is not necessary to, for example, newly fabricate a mask or add a process for the effect of a shield, and accordingly an increase in manufacturing cost is not caused. Thus, according to the present embodiment, the effect of a shield can be obtained more efficiently from the viewpoint of the area of the pixel circuit 210, further from the viewpoint of cost. Further, since display quality can be improved without increasing the area of the pixel circuit 210 as mentioned above, the display device 1 can be used favorably as a display device that downsizing is required of, for example as a display device to be mounted on a wearable device or the like.

Figure 8:
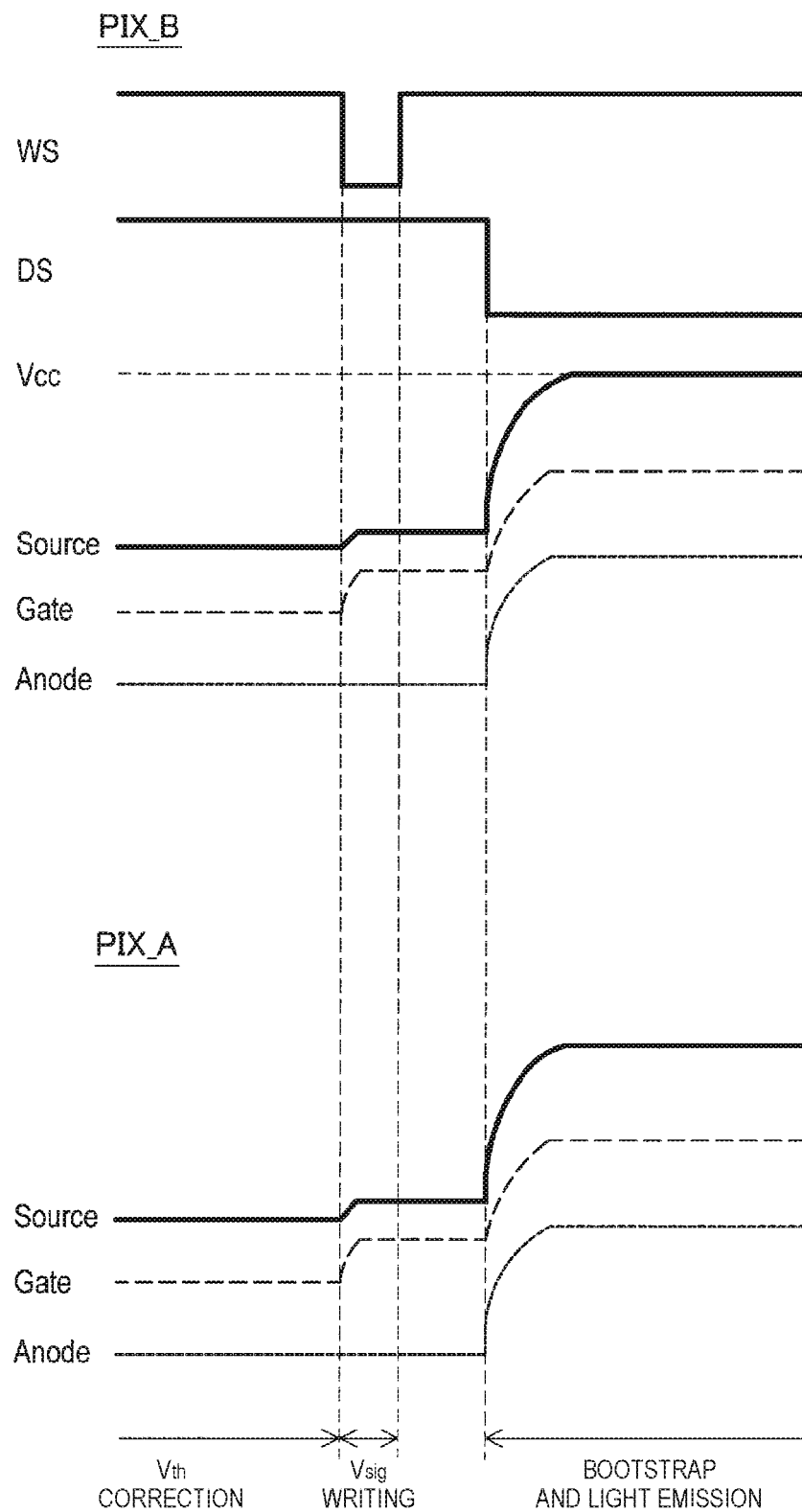
FIG. 8 is a timing waveform diagram when pixel circuits operate in a case where the layout according to the present embodiment shown in FIG. 7 is used.

FIG. 8 is a timing waveform diagram when pixel circuits 210 operate in a case where the layout according to the present embodiment shown in FIG. 7 is used. FIG. 8 mainly shows, similarly to FIG. 6, a timing waveform diagram in the signal writing period to the light emission period. FIG. 8 shows, similarly to FIG. 6, waveforms of the scanning line voltage WS, the first driving line voltage DS, the gate potential (Gate) and the source potential (Source) of the driving transistor 212, and the electric potential (Anode) of the anode region 221 of PIX_B, and waveforms of the gate potential (Gate) and the source potential (Source) of the driving transistor 212 and the electric potential (Anode) of the anode region 221 of PIX_A.

In the present embodiment, the electricity supply region 223 is provided between the anode region 221 of PIX_A and the gate region 222 of PIX_B as shown in FIG. 7, and thereby interference via a parasitic capacitance $C_p$ between both is suppressed. Therefore, as shown in FIG. 8, during the time when the state shifts from the signal writing period to the light emission period and both the gate potential and the source potential of the driving transistor 212 rise up to prescribed values by the bootstrap operation, the gate potential of the driving transistor 212 of PIX_B can be controlled to a desired value, with little influence of the change in the electric potential of the anode region 221 of PIX_A on the change in the electric potential of the gate region 222 of PIX_B (that is, the gate potential of the driving transistor 212 of PIX_B). Therefore, also the gate-source voltage $V_{gs}$ and the drain-source current $I_{ds}$ of the driving transistor 212 of PIX_B can be controlled to desired values with better precision, and a desired luminance can be obtained for the organic light emitting diode 211 of PIX_B.

Here, in the ordinary layout shown in FIG. 5, electricity supply regions 223 are provided at a ratio of one to a plurality of sub-pixels. In this layout, there is a concern that a potential gradient will occur in well potential in the pixel unit 20, that is, the display surface. If such a potential gradient occurs, a difference occurs in well potential between sub-pixels, and consequently uniformity failure such as luminance unevenness may be caused. In contrast, in the present embodiment, the electricity supply region 223 is provided in each sub-pixel as described above, and electricity supply to the well is performed for each sub-pixel. Therefore, a potential gradient of well potential in the display surface is less likely to occur, and substantially the same well potential can be obtained in the sub-pixels. Thus, the occurrence of uniformity failure like the above can be suppressed, and further improvement in display quality can be achieved.

Note that the layout shown in FIG. 7 is only an example, and the present embodiment is not limited to this example. As long as the electricity supply region 223 is provided between adjacent sub-pixels (that is, between pixel circuits 210), the shield effect of the electricity supply region 223 can be exhibited, and interference between sub-pixels can be suppressed. Thus, in the present embodiment, it is sufficient that the electricity supply region 223 be provided between adjacent sub-pixels; and the number and arrangement of electricity supply regions 223 and the shape, area, etc. of the electricity supply region 223 may be determined as appropriate. In practice, the number of transistors and the size of each transistor vary and also the layout of the diffusion layer of transistors varies in accordance with the configuration of the pixel circuit. Thus, the number and arrangement of electricity supply regions 223 and the shape, area, etc. of the electricity supply region 223 may be determined on the basis of the configuration of the pixel circuit 210, the layout of transistors determined in accordance with this configuration, etc. in such a manner that an effect as a shield is exhibited more effectively and interference between adjacent pixel circuits 210 can be suppressed favorably, as appropriate. An appropriate number and arrangement of electricity supply regions 223 and an appropriate shape, area, etc. of the electricity supply region 223 for obtaining an effect as a shield effectively may be determined by, for example, repeating simulation or trial manufacture, as appropriate.

For example, as an example of the arrangement of electricity supply regions 223 other than the arrangement shown in FIG. 7, the electricity supply region 223 may be provided along the boundary between adjacent sub-pixels, as a region having a long-length shape in the direction of the boundary line. In this event, the electricity supply region 223 may be provided in each sub-pixel (that is, independently for each sub-pixel) along the boundary line between sub-pixels, or may be provided on the boundary line between sub-pixels. In a case of being provided on the boundary line between sub-pixels, the electricity supply region 223 is shared by adjacent sub-pixels. Alternatively, the electricity supply region 223 may, instead of being provided only on one side of each sub-pixel, be provided in an outer edge portion of each sub-pixel so as to surround the sub-pixel. Also in this case, the electricity supply region 223 may be provided independently for each sub-pixel along the boundary line between sub-pixels, or the electricity supply region 223 may be shared by adjacent sub-pixels by the electricity supply region 223 being provided on the boundary line between sub-pixels.

Note that, in a case where, as mentioned above, the electricity supply region 223 is provided along the boundary between adjacent sub-pixels or the electricity supply region 223 is provided so as to surround each sub-pixel, it is feared that the area of the electricity supply region 223 will be increased and also the area of the pixel circuit 210 will be increased. Such a situation is not preferable in a small-sized display device 1 that area reduction of the pixel circuit 210 is required of, for example in a display device to be mounted on a wearable device or the like. Thus, in a case where it is desired to avoid arrangement of large-area electricity supply regions 223, an electricity supply region 223 with the minimum area by which an effect as a shield is obtained may be placed in a position whereby interference between adjacent sub-pixels can be suppressed favorably, such as a part between adjacent pixels where a parasitic capacitance $C_p$ is likely to occur, as appropriate.

Note that, if attention is focused only on the obtainment of the effect of suppressing interference between adjacent sub-pixels, the electricity supply region 223 may not necessarily be provided in each sub-pixel on a one-to-one basis. By not providing the electricity supply region 223 in each sub-pixel on a one-to-one basis, the effect of making the area of the sub-pixel smaller is obtained. However, in view of the original role of supplying an electric potential to the well, it is preferable that, as described above, the electricity supply region 223 be provided in each sub-pixel at least on a one-to-one basis, in order to improve display quality.

Alternatively, a plurality of electricity supply regions 223 may be provided in one sub-pixel. For example, in a case where, as mentioned above, an electricity supply region 223 functioning as a shield is formed with a relatively small area for the purpose of making the area of the pixel circuit 210 smaller, there is a concern that the supply of an electric potential to the well cannot be performed stably, due to the fact that the area of the electricity supply region 223 is not sufficiently large. In such a case, an electricity supply region 223 that plays the original role of supplying an electric potential to the well may be further provided in a surplus area in the sub-pixel, separately from the electricity supply region 223 functioning as a shield. Thus, it is preferable that, while the achievement of a function as a shield and the achievement of the function of stably supplying an electric potential to the well are considered comprehensively, the number and arrangement of electricity supply regions 223 and the shape, area, etc. of the electricity supply region 223 be determined such that the area of the pixel circuit 210 is smaller, as appropriate.

(5. Specific Configuration Example of Display Device)

Figure 9:
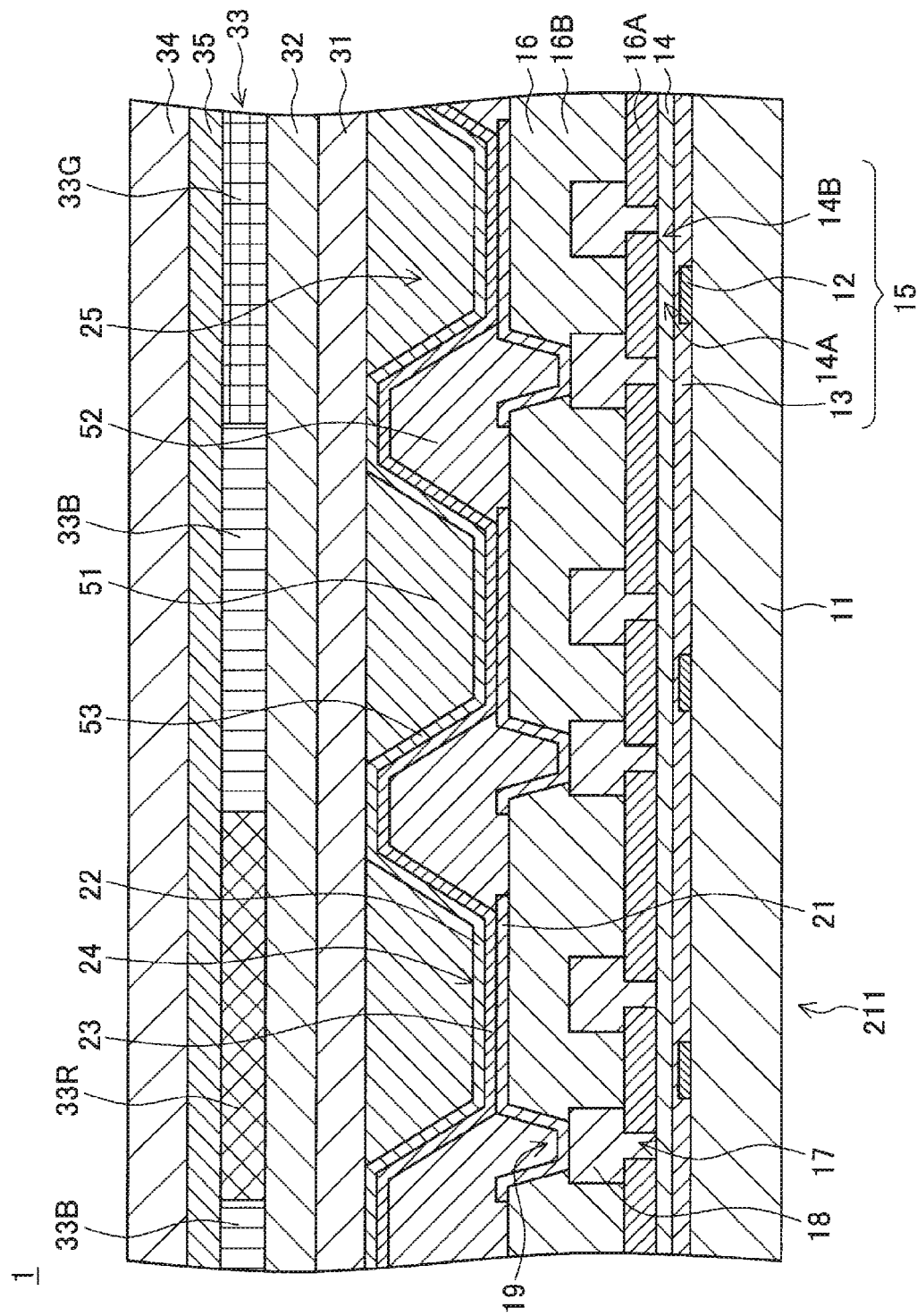
FIG. 9 is a cross-sectional view showing a specific configuration example of the display device according to the present embodiment.

A more specific configuration example of the display device 1 according to the present embodiment described hereinabove will now be described. FIG. 9 is a cross-sectional view showing a specific configuration example of the display device 1 according to the present embodiment. FIG. 9 shows a partial cross-sectional view of the display device 1.

Referring to FIG. 9, the display device 1 according to the present embodiment includes, on a first substrate 11, a plurality of organic light emitting diodes 211 each of which is a light emitting element that emits white light and a CF layer 33 that is provided on the organic light emitting diodes 211 and in which color filters (CFs) of some colors are formed to correspond to the organic light emitting diodes 211. Further, a second substrate 34 that contains a material transparent to light from the organic light emitting diode 211 is placed on the CF layer 33. Further, on the first substrate 11, thin film transistors (TFTs) 15 for driving the organic light emitting diode 211 are provided to correspond to each of the organic light emitting diodes 211. The TFT 15 corresponds to each of the transistors included in the pixel circuit described above (the driving transistor 212, the sampling transistor 213, the light emission control transistor 214, and the switching transistor 217). An arbitrary organic light emitting diode 211 is selectively driven by the TFTs 15; light from the driven organic light emitting diode 211 passes through the corresponding CF and the color of the light is converted as appropriate; and the light is emitted from the upper side via the second substrate 34; thereby, a desired image, a desired character, etc. are displayed.

Note that, in the following description, the stacking direction of the layers in the display device 1 is referred to also as an up and down direction. In this event, the side on which the first substrate 11 is placed is defined as a down side, and the side on which the second substrate 34 is placed is defined as an up side. Further, a plane perpendicular to the up and down direction is referred to also as a horizontal plane.

Thus, the display device 1 shown in FIG. 9 is a top emission display device capable of color display that is driven by an active matrix system. However, the present embodiment is not limited to this example, and the display device 1 according to the present embodiment may be a bottom emission display device that emits light via the first substrate 11.

(First Substrate and Second Substrate)

In the illustrated configuration example, the first substrate 11 includes a silicon substrate. Further, the second substrate 34 contains quartz glass. However, the present embodiment is not limited to this example, and various known materials may be used as the first substrate 11 and the second substrate 34. For example, each of the first substrate 11 and the second substrate 34 may include a high strain point glass substrate, a soda-lime glass (a mixture of $Na_2O$, CaO, and $SiO_2$) substrate, a borosilicate glass (a mixture of $Na_2O$, $B_2O_3$, and $SiO_2$) substrate, a forsterite ($Mg_2SiO_4$) substrate, a lead glass (a mixture of $Na_2O$, PbO, and $SiO_2$) substrate, various glass substrates in which an insulating film is formed on a surface, a quartz substrate, a quartz substrate in which an insulating film is formed on a surface, a silicon substrate in which an insulating film is formed on a surface, or an organic polymer substrate (for example, polymethyl methacrylate (PMMA), polyvinyl alcohol (PVA), polyvinylphenol (PVP), a polyether sulfone (PES), a polyimide, a polycarbonate, polyethylene terephthalate (PET), or the like). The materials contained in the first substrate 11 and the second substrate 34 may be the same, or may be different. However, since the display device 1 is of the top emission type as described above, the second substrate 34 preferably contains a material with a high transmittance that can transmit the light from the organic light emitting diode 211 favorably.

(Light Emitting Element and Second Member)

The organic light emitting diode 211 includes a first electrode 21, an organic layer 23 provided on the first electrode 21, and a second electrode 22 formed on the organic layer 23. More specifically, a second member 52 in which openings 25 are provided so as to expose at least parts of the first electrode 21 is stacked on the first electrode 21, and the organic layer 23 is provided on portions of the first electrode 21 that are exposed at the bottoms of the openings 25. That is, the organic light emitting diode 211 has a configuration in which the first electrode 21, the organic layer 23, and the second electrode 22 are stacked in this order in the opening 25 of the second member 52. This stacked structure functions as a luminescence section 24 of each pixel. That is, a portion of the organic light emitting diode 211 falling under the opening 25 of the second member 52 serves as a luminescence surface. Further, the second member 52 functions as a pixel defining film that is provided between pixels and partitions the area of the pixel.

The organic layer 23 includes a luminescence layer containing an organic luminescent material, and can emit white light. The specific configuration of the organic layer 23 is not limited, and may be various publicly known configurations. For example, the organic layer 23 may have a stacked structure of a hole transport layer, a luminescence layer, and an electronic transport layer, a stacked structure of a hole transport layer and a luminescence layer that serves also as an electronic transport layer, a stacked structure of a hole injection layer, a hole transport layer, a luminescence layer, an electronic transport layer, and an electron injection layer, or the like. Further, in a case where each of these stacked structures or the like is used as a "tandem unit," the organic layer 23 may have a tandem structure of two stages in which a first tandem unit, a connection layer, and a second tandem unit are stacked. Alternatively, the organic layer 23 may have a tandem structure of three or more stages in which three or more tandem units are stacked. In a case where the organic layer 23 includes a plurality of tandem units, an organic layer 23 that emits white light as a whole can be obtained by assigning red, green, and blue to the luminescent colors of the luminescence layers of the tandem units.

In the illustrated configuration example, the organic layer 23 is formed by depositing an organic material by vacuum vapor deposition. However, the present embodiment is not limited to this example, and the organic layer 23 may be formed by various publicly known methods. For example, as the method for forming the organic layer 23, physical vapor deposition methods (PVD methods) such as the vacuum vapor deposition method, printing methods such as the screen printing method and the inkjet printing method, a laser transfer method in which a stacked structure of a laser absorbing layer and an organic layer formed on a substrate for transfer is irradiated with laser light to separate the organic layer on the laser absorbing layer and the organic layer is transferred, various application methods, etc. may be used.

The first electrode 21 functions as an anode. Since the display device 1 is of the top emission type as described above, the first electrode 21 contains a material capable of reflecting the light from the organic layer 23. In the illustrated configuration example, the first electrode 21 contains an alloy of aluminum and neodymium (Al—Nd alloy). Further, the film thickness of the first electrode 21 is approximately 0.1 µm to 1 µm, for example. However, the present embodiment is not limited to this example, and the first electrode 21 may contain various publicly known materials used as the material of an electrode on the light reflection side that functions as an anode in a common organic EL display device. Further, the film thickness of the first electrode 21 is not limited to the above example either, and the first electrode 21 may be formed in film thickness ranges commonly employed in organic EL display devices, as appropriate.

For example, the first electrode 21 may contain a metal with a high work function, such as platinum (Pt), gold (Au), silver (Ag), chromium (Cr), tungsten (W), nickel (Ni), copper (Cu), iron (Fe), cobalt (Co), or tantalum (Ta), or an alloy with a high work function (for example, a Ag—Pd—Cu alloy containing silver as a main component and containing 0.3 mass % to 1 mass % of palladium (Pd) and 0.3 mass % to 1 mass % of copper, an Al—Nd alloy, or the like). Alternatively, the first electrode 21 may contain an electrically conductive material having a small work function value and a high light reflectance, such as aluminum or an alloy containing aluminum. In this case, it is preferable to improve hole injection properties by providing an appropriate hole injection layer on the first electrode 21, or the like. Alternatively, the first electrode 21 may have a structure in which a transparent electrically conductive material excellent in hole injection characteristics, such as an oxide of indium and tin (ITO) or an oxide of indium and zinc (IZO), is stacked on a reflective film with high light reflectivity such as a dielectric multiple-layer film or aluminum.

The second electrode 22 functions as a cathode. Since the display device 1 is of the top emission type as described above, the second electrode 22 contains a material capable of transmitting the light from the organic layer 23. In the illustrated configuration example, the second electrode 22 contains an alloy of magnesium and silver (Mg—Ag alloy). Further, the film thickness of the second electrode 22 is approximately 10 nm, for example. However, the present embodiment is not limited to this example, and the second electrode 22 may contain various publicly known materials used as the material of an electrode on the light transmission side that functions as a cathode in a common organic EL display device. Further, the film thickness of the second electrode 22 is not limited to the above example either, and the second electrode 22 may be formed in film thickness ranges commonly employed in organic EL display devices, as appropriate.

For example, the second electrode 22 may contain aluminum, silver, magnesium, calcium (Ca), sodium (Na), strontium (Sr), an alloy of an alkali metal and silver, an alloy of an alkaline earth metal and silver (for example, an alloy of magnesium and silver (Mg—Ag alloy)), an alloy of magnesium and calcium (Mg—Ca alloy), an alloy of aluminum and lithium (Al—Li alloy), or the like. In a case where each of these materials is used in a single layer, the film thickness of the second electrode 22 is approximately 4 nm to 50 nm, for example. Alternatively, the second electrode 22 may have a structure in which a layer of any of the materials described above and a transparent electrode containing, for example, ITO or IZO (with a thickness of, for example, approximately 30 nm to 1 µm) are stacked from the organic layer 23 side. In a case where such a stacked structure is used, the thickness of the layer of any of the materials described above may be as thin as approximately 1 nm to 4 nm, for example. Alternatively, the second electrode 22 may include only a transparent electrode. Alternatively, the second electrode 22 may be provided with a bus electrode (auxiliary electrode) containing a low resistance material, such as aluminum, an aluminum alloy, silver, a silver alloy, copper, a copper alloy, gold, or a gold alloy, to reduce the resistance of the second electrode 22 as a whole.

In the illustrated configuration example, each of the first electrode 21 and the second electrode 22 is formed by forming a material as a film with a prescribed thickness by the vacuum vapor deposition method and then patterning the film by the etching method. However, the present embodiment is not limited to this example, and the first electrode 21 and the second electrode 22 may be formed by various publicly known methods. Examples of the method for forming the first electrode 21 and the second electrode 22 include vapor deposition methods including the electron beam vapor deposition method, the hot filament vapor deposition method, and the vacuum vapor deposition method, the sputtering method, the chemical vapor deposition method (CVD method), the metal organic chemical vapor deposition method (MOCVD method), a combination of the ion plating method and the etching method, various printing methods (for example, the screen printing method, the inkjet printing method, the metal mask printing method, etc.), plating methods (the electroplating method, the electroless plating method, etc.), the lift-off method, the laser ablation method, the sol-gel method, etc.

The second member 52 is formed by forming $SiO_2$ as a film with a prescribed film thickness by the CVD method and then patterning the $SiO_2$ film using photolithography technology and etching technology. However, the material of the second member 52 is not limited to this example, and various materials having insulating properties may be used as the material of the second member 52. Examples of the material contained in the second member 52 include $SiO_2$, MgF, LiF, a polyimide resin, an acrylic resin, a fluorine resin, a silicone resin, a fluorine-based polymer, a silicone-based polymer, etc. However, as described later, the second member 52 contains a material having a lower refractive index than the material of a first member 51.

(Configuration of Parts Below Light Emitting Element)

On the first substrate 11, the first electrode 21 included in the organic light emitting diode 211 is provided on an interlayer insulating layer 16 containing SiON. Then, the interlayer insulating layer 16 covers a light emitting element driving section formed on the first substrate 11.

The light emitting element driving section includes a plurality of TFTs 15. In other words, the light emitting element driving section corresponds to a driving circuit of the pixel circuit 210. The TFT 15 includes a gate electrode 12 formed on the first substrate 11, a gate insulating film 13 formed on the first substrate 11 and the gate electrode 12, and a semiconductor layer 14 formed on the gate insulating film 13. A region of the semiconductor layer 14 located immediately above the gate electrode 12 functions as a channel region 14A, and regions located so as to sandwich the channel region 14A function as source/drain regions 14B. Note that, although in the illustrated example the TFT 15 is of a bottom gate type, the present embodiment is not limited to this example, and the TFT 15 may be of a top gate type.

An interlayer insulating layer 16 including two layers (a lower layer interlayer insulating layer 16A and an upper layer interlayer insulating layer 16B) is stacked on the semiconductor layer 14 by the CVD method. In this event, after the lower layer interlayer insulating layer 16A is stacked, contact holes 17 are provided in portions of the lower layer interlayer insulating layer 16A corresponding to the source/drain regions 14B so as to expose the source/drain regions 14B, by using photolithography technology and etching technology, for example, and an interconnection 18 containing aluminum is formed so as to fill the contact hole 17. The interconnections 18 are formed by combining the vacuum vapor deposition method and the etching method, for example. After that, the upper layer interlayer insulating layer 16B is stacked.

In a portion of the upper layer interlayer insulating layer 16B where the interconnection 18 is provided, a contact hole 19 is provided so as to expose the interconnection 18, by using photolithography technology and etching technology, for example. Then, when forming the first electrode 21 of the organic light emitting diode 211, the first electrode 21 is formed so as to be in contact with the interconnection 18 via the contact hole 19. Thus, the first electrode 21 of the organic light emitting diode 211 is electrically connected to a source/drain region 14B of a TFT 15 (in the example of the pixel circuit shown in FIG. 3, corresponding to the drain region of the driving transistor 212) via the interconnection 18.

Note that, although in the above example the interlayer insulating layer 16 contains SiON, the present embodiment is not limited to this example. The interlayer insulating layer 16 may contain various publicly known materials that can be used as an interlayer insulating layer in a common organic EL display device. For example, as the material contained in the interlayer insulating layer 16, $SiO_2$-based materials (for example, $SiO_2$, BPSG, PSG, BSG, AsSG, PbSG, SiON, spin-on glass (SOG), low melting point glass, a glass paste, and the like), SiN-based materials, and insulating resins (for example, a polyimide resin, a novolac-based resin, an acrylic-based resin, polybenzoxazole, and the like) may be used singly or in combination, as appropriate. Further, the method for forming the interlayer insulating layer 16 is not limited to the above example either, and publicly known methods such as the CVD method, the application method, the sputtering method, and various printing methods may be used for the formation of the interlayer insulating layer 16. Furthermore, although in the above example the interconnection 18 is formed by forming aluminum as a film and patterning the film by the vacuum vapor deposition method and the etching method, the present embodiment is not limited to this example. The interconnection 18 may be formed by forming, as a film, any of various materials that are used as an interconnection in a common organic EL display device and patterning the film by various methods.

(Configuration of Parts Above Light Emitting Element)

The opening 25 provided in the second member 52 of the organic light emitting diode 211 is formed so as to have a tapered shape in which the side wall of the opening 25 is inclined such that the opening area increases with proximity to the bottom. Then, a first member 51 is put in the opening 25. That is, the first member 51 is a layer that is provided immediately above the luminescence surface of the organic light emitting diode 211 and that propagates emission light from the light emitting element upward. Further, by forming the opening 25 of the second member 52 in the above manner, a cross-sectional shape in the stacking direction of the first member 51 (that is, the illustrated cross-sectional shape) has a substantially trapezoidal shape, and thus the first member 51 has a truncated conical or pyramidal shape in which the bottom surface faces up.

The first member 51 is formed by forming $Si_{1-x}N_x$ as a film by the vacuum vapor deposition method so as to fill the opening 25, and then planarizing the surface of the $Si_{1-x}N_x$ film by the chemical mechanical polishing method (CMP method) or the like. However, the material of the first member 51 is not limited to this example, and various materials having insulating properties may be used as the material of the first member 51. Examples of the material contained in the first member 51 include $Si_{1-x}N_x$, ITO, IZO, $TiO_2$, $Nb_2O_5$, a bromine-containing polymer, a sulfur-containing polymer, a titanium-containing polymer, a zirconium-containing polymer, etc. The method for forming the first member 51 is not limited to this example either, and various publicly known methods may be used as the method for forming the first member 51.

However, in the present embodiment, the materials of the first member 51 and the second member 52 are selected such that the refractive index $n_1$ of the first member 51 and the refractive index $n_2$ of the second member 52 satisfy the relation of $n_1 > n_2$. By selecting the materials of the first member 51 and the second member 52 such that the refractive indices satisfy the relation mentioned above, at least a part of the light that has propagated through the first member 51 is reflected at a surface of the second member 52 facing the first member 51. More specifically, the organic layer 23 and the second electrode 22 of the organic light emitting diode 211 are formed between the first member 51 and the second member 52, and therefore at least a part of the light that has propagated through the first member 51 is reflected at the interface between the second member 52 and the organic layer 23. That is, the surface of the second member 52 facing the first member 51 functions as a light reflection section (reflector) 53.

In the present embodiment, the first member 51 is provided immediately above the luminescence surface of the organic light emitting diode 211, as mentioned above. Then, the first member 51 has a truncated conical or pyramidal shape in which the bottom surface faces up, and therefore light emitted from the luminescence surface of the organic light emitting diode 211 is reflected upward, which is the light emission direction, by the interface between the first member 51 and the second member 52, that is, the reflector 53. Thus, according to the present embodiment, the efficiency of extracting emission light from the organic light emitting diode 211 can be improved by providing the reflector 53, and the luminance as the entire display device 1 can be improved.

Note that an investigation by the present inventors shows that, to improve the efficiency of extracting emission light from the organic light emitting diode 211 more favorably, it is preferable that the refractive indices of the first member 51 and the second member 52 satisfy the relation of $n_1 - n_2 \geq 0.20$. It is more preferable that the refractive indices of the first member 51 and the second member 52 satisfy the relation of $n_1 - n_2 \geq 0.30$. Furthermore, to further improve the efficiency of extracting emission light from the organic light emitting diode 211, it is preferable that the shape of the first member 51 satisfy the relations of $0.5 \leq R_1/R_2 \leq 0.8$ and $0.5 \leq H/R_1 \leq 0.8$. Here, $R_1$ represents the diameter of the light incidence surface of the first member 51 (that is, a surface facing down in the stacking direction and facing the luminescence surface of the organic light emitting diode 211), $R_2$ represents the diameter of the light emitting surface of the first member 51 (that is, a surface facing up in the stacking direction), and H represents the distance between the bottom surface and the upper surface (the height in the stacking direction) in a case where the first member 51 is regarded as a truncated cone or pyramid.

A protection film 31 and a planarizing film 32 are stacked in this order on the planarized first member 51. The protection film 31 is formed by, for example, stacking $Si_{1-y}N_y$ with a prescribed film thickness (approximately 3.0 μm) by the vacuum vapor deposition method. Further, the planarizing film 32 is formed by, for example, stacking $SiO_2$ with a prescribed film thickness (approximately 2.0 μm) by the CVD method and planarizing the surface by the CMP method or the like.

However, the materials and the film thicknesses of the protection film 31 and the planarizing film 32 are not limited to these examples, and the protection film 31 and the planarizing film 32 may contain various publicly known materials used as a protection film and a planarizing film of a common organic EL display device so as to have film thicknesses commonly employed in an organic EL display device, as appropriate.

However, in the present embodiment, it is preferable that the material of the protection film 31 be selected such that the refractive index $n_3$ of the protection film 31 is equal to the refractive index $n_1$ of the first member 51 or smaller than the refractive index $n_1$ of the first member 51. Furthermore, the materials of the protection film 31 and the planarizing film 32 are selected such that the absolute value of the difference between the refractive index $n_3$ of the protection film 31 and the refractive index $n_4$ of the planarizing film 32 is preferably less than or equal to 0.30 and more preferably less than or equal to 0.20. By thus selecting the materials of the protection film 31 and the planarizing film 32, the reflection or scattering of emission light from the organic light emitting diode 211 at the interface between the first member 51 and the protection film 31 and the interface between the protection film 31 and the planarizing film 32 can be suppressed, and light extraction efficiency can be further improved.

The CF layer 33 is formed on the planarizing film 32. Thus, the display device 1 is a display device of what is called an on-chip color filter (OCCF) system in which the CF layer 33 is formed on the first substrate 11 on which the organic light emitting diode 211 is formed. The second substrate 34 is stuck to the upper side of the CF layer 33 via, for example, a sealing resin film 35 of an epoxy resin or the like, and thereby the display device 1 is fabricated. Note that the material of the sealing resin film 35 is not limited to this example, and the material of the sealing resin film 35 may be selected in view of high transmissivity to the emission light from the organic light emitting diode 211, excellence in adhesiveness to the CF layer 33 located on the lower side and the second substrate 34 located on the upper side, low reflectivity of light at the interface with the CF layer 33 located on the lower side and the interface with the second substrate 34 located on the upper side, etc., as appropriate. However, the present embodiment is not limited to this example. The display device 1 may be a display device of what is called a facing CF system that is fabricated by the CF layer 33 being formed on the second substrate 34, and the first substrate 11 and the second substrate 34 being stuck together such that the CF layer 33 faces the organic light emitting diode 211.

The CF layer 33 is formed such that a CF of each color having a prescribed area is provided for each of the organic light emitting diode 211. The CF layer 33 may be formed by performing exposure on a resist material into a prescribed configuration and performing development by photolithography technology, for example. Further, the film thickness of the CF layer 33 is approximately 2 μm, for example. However, the material, the formation method, and the film thickness of the CF layer 33 are not limited to these examples, and the CF layer 33 may be formed so as to have a film thickness commonly employed in an organic EL display device by using various publicly known materials that are used as a CF layer of a common organic EL display device and various publicly known methods, as appropriate.

In the illustrated example, the CF layer 33 is provided such that a red CF 33R, a green CF 33G, and a blue CF 33B each having a prescribed area are continuously distributed in the horizontal plane. Note that, in the following description, in a case where there is no need to particularly distinguish the CF 33R, the CF 33G, and the CF 33B, one or a plurality of these may be written as simply a CF 33a. One sub-pixel includes a combination of one organic light emitting diode 211 and one CF 33a.

Hereinabove, a specific configuration example of the display device 1 is described. Note that, in regard to the configuration of the display device 1 described hereinabove, particularly the configuration of the reflector 53, JP 2013-191533A, which is a prior application by the present applicant, may be referred to, for example. However, the configuration of the display device 1 according to the present embodiment is not limited to this example. As described above, it is sufficient that the respects described in (4-2. Layout according to present embodiment) above be reflected in the display device 1 according to the present embodiment, and various known configurations used in ordinary display devices may be used for the other respects.

(6. Application Examples)

Application examples of the display device 1 according to the present embodiment described hereinabove will now be described. Herein, some examples of electronic apparatuses in which the display device 1 according to the present embodiment described hereinabove can be used are described.

Figure 10:
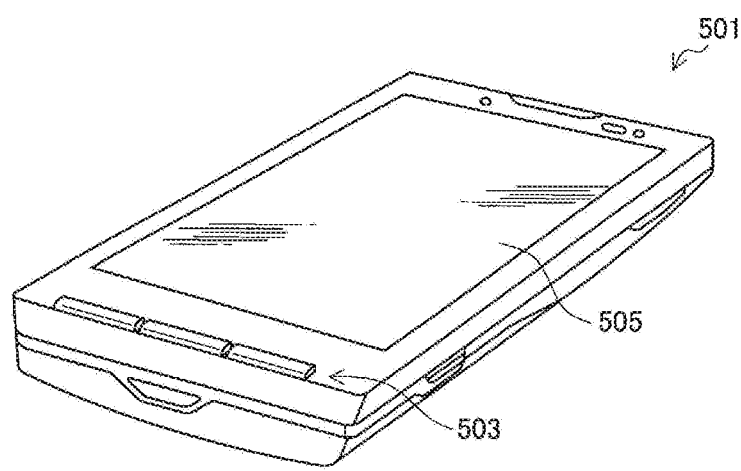
FIG. 10 is a diagram showing an external appearance of a smartphone that is an example of an electronic apparatus in which the display device according to the present embodiment can be used.

FIG. 10 is a diagram showing an external appearance of a smartphone that is an example of the electronic apparatus in which the display device 1 according to the present embodiment can be used. As shown in FIG. 10, a smartphone 501 includes an operation section 503 that includes a button and accepts an operation input by the user and a display section 505 that displays various pieces of information. The display device 1 may be applied to the display section 505.

Figure 11:
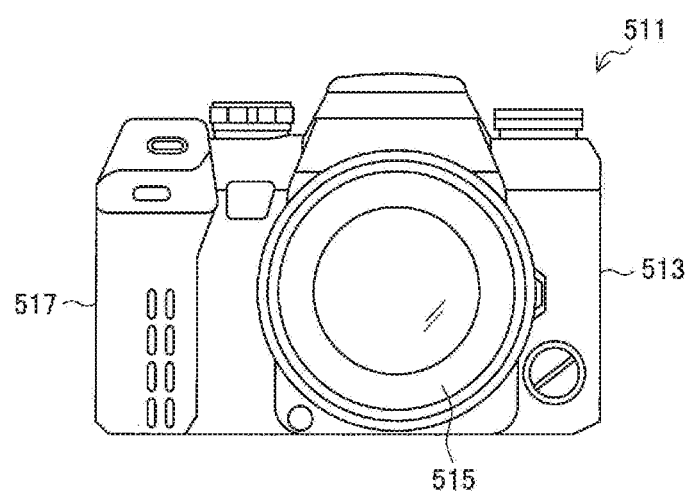
FIG. 11 is a diagram showing an external appearance of a digital camera that is another example of an electronic apparatus in which the display device according to the present embodiment can be used.
Figure 12:
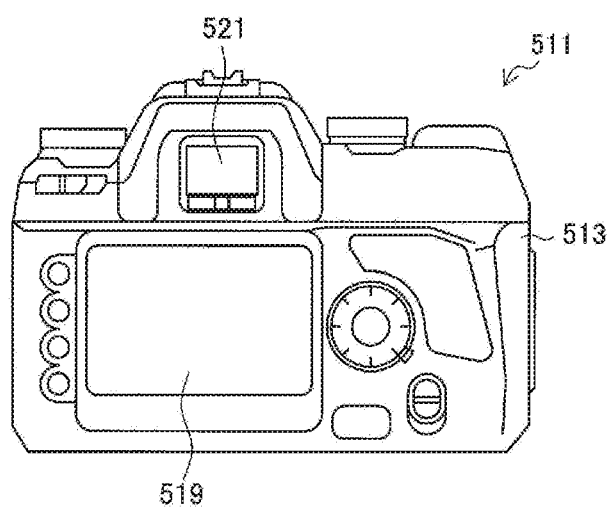
FIG. 12 is a diagram showing an external appearance of the digital camera that is the other example of the electronic apparatus in which the display device according to the present embodiment can be used.

FIG. 11 and FIG. 12 are diagrams showing external appearances of a digital camera that is another example of the electronic apparatus in which the display device 1 according to the present embodiment can be used. FIG. 11 shows an external appearance of a digital camera 511 as seen from the front side (the subject side), and FIG. 12 shows an external appearance of the digital camera 511 as seen from the rear side. As shown in FIG. 11 and FIG. 12, the digital camera 511 includes a main body section (camera body) 513, a replaceable lens unit 515, a grip section 517 that is gripped by the user during photographing, a monitor 519 that displays various pieces of information, and an electronic view finder (EVF) 521 that displays a through image that is observed by the user during photographing. The display device 1 may be applied to the monitor 519 and the EVF 521.

Figure 13:
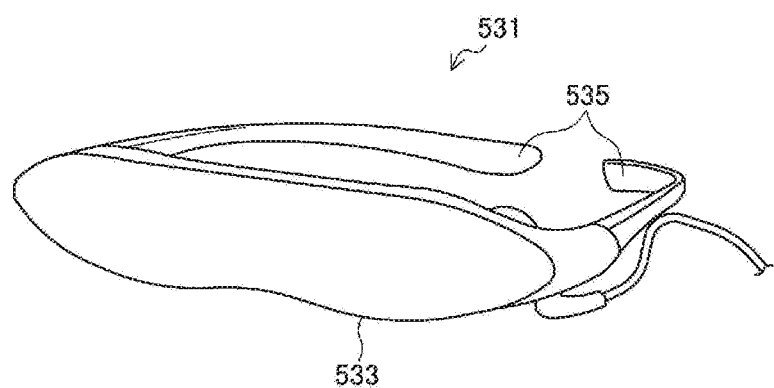
FIG. 13 is a diagram showing an external appearance of a head-mounted display that is another example of an electronic apparatus in which the display device according to the present embodiment can be used.

FIG. 13 is a diagram showing an external appearance of a head mounted display (HMD) that is another example of the electronic apparatus in which the display device 1 according to the present embodiment can be used. As shown in FIG. 13, an HMD 531 includes an eyeglass-type display section 533 that displays various pieces of information and ear-fixing sections 535 that are fixed to the user's ears during wearing. The display device 1 may be applied to the display section 533.

Hereinabove, some examples of the electronic apparatus in which the display device 1 according to the present embodiment can be used are described. Note that the electronic apparatus in which the display device 1 can be used is not limited to those described above as examples, and the display device 1 can be used for display devices that are mounted on electronic apparatuses in all fields that perform display on the basis of an image signal inputted from the outside or an image signal generated in the inside, such as a television device, an electronic book, a smart phone, a personal digital assistant (PDA), a notebook personal computer (PC), a video camera, and a game apparatus.

(7. Supplement)

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, although in the embodiment described above each of the transistors (the driving transistor 212, the sampling transistor 213, the light emission control transistor 214, and the switching transistor 217) included in the driving circuit of the pixel circuit 210 is of a P-channel type, the technology according to the present disclosure is not limited to this example. For example, each of these transistors may be of an N-channel type.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A display device including:

a pixel unit in which a plurality of pixel circuits each of which includes a light emitting element and a driving circuit configured to drive the light emitting element are arranged in a matrix form, in which, in a diffusion layer in which transistors included in the driving circuits of the pixel circuits are formed, an electricity supply region that is an active area for supplying an electric potential to a well is provided between mutually adjacent ones of the pixel circuits.

(2)

The display device according to (1), in which the electricity supply region is provided at least in a part between active areas where a parasitic capacitance is caused to occur, between mutually adjacent ones of the pixel circuits.

(3)

The display device according to (1) or (2), in which the electricity supply region is provided in each of the pixel circuits at least on a one-to-one basis.

(4)

The display device according to any one of (1) to (3), in which the electricity supply region is provided along a boundary between mutually adjacent ones of the pixel circuits.

(5)

The display device according to any one of (1) to (3), in which the electricity supply region is provided so as to surround each of the pixel circuits.

(6)

The display device according to any one of (1) to (5), in which a plurality of the electricity supply regions are provided in each of the pixel circuits.

(7)

The display device according to any one of (1) to (6), in which the light emitting element is an organic light emitting diode.

(8)

An electronic apparatus including:

a display device configured to perform display on a basis of a video signal, in which the display device includes a pixel unit in which a plurality of pixel circuits each of which includes a light emitting element and a driving circuit configured to drive the light emitting element are arranged in a matrix form, and in a diffusion layer in which transistors included in the driving circuits of the pixel circuits are formed, an electricity supply region that is an active area for supplying an electric potential to a well is provided between mutually adjacent ones of the pixel circuits.

REFERENCE SIGNS LIST 1 display device
10 display panel
20 pixel unit
30 scanning unit
40 selection unit
210 pixel circuit
211 organic light emitting diode
212 driving transistor
213 sampling transistor
214 light emission control transistor
215 holding capacitance
216 auxiliary capacitance
217 switching transistor
221 anode region
222 gate region
223 electricity supply region
301 writing scanning unit
302 scanning line
311 first driving scanning unit
312 first driving line
321 second driving scanning unit
322 second driving line
331 common power supply line
332 power supply line
333 ground line
401 signal output unit
402 signal line
501 smartphone (electronic apparatus)
511 digital camera (electronic apparatus)
531 HMD (electronic apparatus)

The invention claimed is:

1. A display device comprising:
a plurality of pixel circuits comprising a first pixel circuit and a second pixel circuit, and each of the first pixel circuit and the second pixel circuit comprises a driving circuit and a light emitting element,
the driving circuit comprises a driving transistor, a sampling transistor, and a first switching transistor,
a first terminal of the driving transistor is configured to output a current to an anode electrode of the light emitting element,
the sampling transistor is connected between a signal line and a control terminal of the driving transistor; and
a plurality of electricity supply regions, wherein one or more of the plurality of electricity supply regions is at least partially disposed between the sampling transistor of the first pixel circuit and the sampling transistor the second pixel circuit.

2. The display device according to claim 1,
wherein an active region of the driving transistor and an active region of the first switching transistor are continuously formed.

3. The display device according to claim 1, further comprising:
a first contact region between the anode electrode of the light emitting element of the first pixel circuit and a first terminal of the switching transistor of the first pixel circuit; and
a second contact region between the anode electrode of the light emitting element of the second pixel circuit and a first terminal of the switching transistor of the second pixel circuit.

4. The display device according to claim 3,
wherein one of the plurality of electricity supply regions is disposed in a third region at least partially between the first contact region and the second contact region.

5. The display device according to claim 1,
wherein the driving transistor includes a back gate structure.

6. The display device according to claim 1,
wherein each of the driving transistor and the sampling transistor includes a back gate structure.

7. The display device according to claim 1,
wherein the driving transistor, the sampling transistor, and the first switching transistor are P-channel type transistors.

8. An electronic apparatus comprising:
a display device including:
- a plurality of pixel circuits comprising a first pixel circuit and a second pixel circuit, and each of the first pixel circuit and the second pixel circuit comprises a driving circuit and a light emitting element,
the driving circuit comprises a driving transistor, a sampling transistor, and a first switching transistor;
a first terminal of the driving transistor is configured to output a current to an anode electrode of the light emitting element,
the sampling transistor is connected between a signal line and a control terminal of the driving transistor; and
a plurality of electricity supply regions, wherein one or more of the plurality of electricity supply regions is at least partially disposed between the sampling transistor of the first pixel circuit and the sampling transistor of the second pixel circuit.

9. The electronic apparatus according to claim 8,
wherein active region of the driving transistor and an active region of the first switching transistor are continuously formed.

10. The electronic apparatus according to claim 8, further comprising:
a first contact region between the anode electrode of the light emitting element of the first pixel circuit and a first terminal of the switching transistor of the first pixel circuit; and
a second contact region between the anode electrode of the light emitting element of the second pixel circuit and a first terminal of the switching transistor of the second pixel circuit.

11. The electronic apparatus according to claim 10,
wherein one of the plurality of electricity supply regions is disposed in a third region at least partially between the first contact region and the second contact region.

12. The electronic apparatus according to claim 8,
wherein the driving transistor includes a back gate structure.

13. The electronic apparatus according to claim 8,
wherein each of the driving transistor and the sampling transistor includes a back gate structure.

14. The electronic apparatus according to claim 8,
wherein the driving transistor, the sampling transistor, and the first switching transistor and are P-channel type transistors.

15. The display device according to claim 1,
wherein the one of the plurality of electricity supply regions is disposed at a same layer as an active region of the sampling transistor.

16. The display device according to claim 1,
wherein the plurality of pixel circuits further includes a third pixel circuit between the first pixel circuit and the second pixel circuit, and the third pixel circuit comprises a third driving circuit and a third light emitting element,
wherein the third driving circuit comprises a third driving transistor, a third sampling transistor, and a third switching transistor,
wherein a first terminal of the third driving transistor is configured to output a current to an anode electrode of the third light emitting element,
wherein the third sampling transistor is connected between the signal line and a control terminal of the third driving transistor,
wherein a first one of the plurality of electricity supply regions is at least partially disposed between the sampling transistor associated with the first pixel circuit and the third sampling transistor, and
wherein a second one of the plurality of electricity supply regions is at least partially disposed between the sampling transistor associated with the first pixel circuit and the sampling transistor associated with the second pixel circuit.

17. The electronic apparatus according to claim 8,
wherein the one of the plurality of electricity supply regions is disposed at a same layer as an active region of the sampling transistor.

18. The electronic apparatus according to claim 8,
wherein the plurality of pixel circuits further includes a third pixel circuit between the first pixel circuit and the second pixel circuit, and the third pixel circuit comprises a third driving circuit and a third light emitting element,
wherein the third driving circuit comprises a third driving transistor, a third sampling transistor, and a third switching transistor,
wherein a first terminal of the third driving transistor is configured to output a current to an anode electrode of the third light emitting element,
wherein the third sampling transistor is connected between the signal line and a control terminal of the third driving transistor,
wherein a first one of the plurality of electricity supply regions is at least partially disposed between the sampling transistor associated with the first pixel circuit and the third sampling transistor, and
wherein a second one of the plurality of electricity supply regions is at least partially disposed between the sampling transistor associated with the first pixel circuit and the sampling transistor associated with the second pixel circuit.

19. A display device comprising:
a plurality of pixel circuits comprising a first pixel circuit and a second pixel circuit, the first pixel circuit including a first driving circuit and a first light emitting element, and the second pixel circuit including a second driving circuit and a second light emitting element,
the first driving circuit comprises a first driving transistor, a first sampling transistor, and a first switching transistor, a first terminal of the first driving transistor is electrically connected to an anode electrode of the first light emitting element, the first sampling transistor is connected between a signal line and a control terminal of the first driving transistor, and
the second driving circuit comprises a second driving transistor, a second sampling transistor, and a second switching transistor, a first terminal of the second driving transistor is electrically connected to an anode electrode of the second light emitting element, the second sampling transistor is connected between the signal line and a control terminal of the second driving transistor; and
a plurality of electricity supply regions, wherein one or more of the plurality of electricity supply regions is at least partially disposed between the first sampling transistor and the second sampling transistor.

20. The display device according to claim 19,
- wherein the plurality of pixel circuits further includes a third pixel circuit between the first pixel circuit and the second pixel circuit, and the third pixel circuit comprises a third driving circuit and a third light emitting element,
- wherein the third driving circuit comprises a third driving transistor, a third sampling transistor, and a third switching transistor,
- wherein a first terminal of the third driving transistor is electrically connected to an anode electrode of the third light emitting element,
- wherein the third sampling transistor is connected between the signal line and a control terminal of the third driving transistor,
- wherein a first one of the plurality of electricity supply regions is at least partially disposed between the first sampling transistor and the third sampling transistor, and
- wherein a second one of the plurality of electricity supply regions is at least partially disposed between the first sampling transistor and the second sampling transistor.

* * * * *